(12) United States Patent
Okazaki et al.

(10) Patent No.: US 6,900,916 B2
(45) Date of Patent: May 31, 2005

(54) COLOR LASER DISPLAY APPARATUS HAVING FLUORESCENT SCREEN SCANNED WITH MODULATED ULTRAVIOLET LASER LIGHT

(75) Inventors: Yoji Okazaki, Kaisei-machi (JP); Kazuhiko Nagano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 99 days.

(21) Appl. No.: 09/987,049

(22) Filed: Nov. 13, 2001

(65) Prior Publication Data

US 2002/0122260 A1 Sep. 5, 2002

Related U.S. Application Data

(63) Continuation-in-part of application No. 09/519,881, filed on Mar. 6, 2000, now abandoned.

(51) Int. Cl.$^7$ ............................................. G02B 26/08
(52) U.S. Cl. ...................................... 359/202; 359/204
(58) Field of Search ............................... 359/202, 204, 359/330, 336

(56) References Cited

U.S. PATENT DOCUMENTS

| | | | |
|---|---|---|---|
| 3,655,575 A | 4/1972 | Faria et al. | |
| 3,699,478 A | 10/1972 | Pinnow et al. | |
| 4,213,153 A | 7/1980 | Schafer | |
| 5,007,107 A | 4/1991 | Takiguchi et al. | |
| 5,311,360 A | 5/1994 | Bloom et al. | ............... 359/572 |
| 5,321,713 A | 6/1994 | Khan et al. | |
| 5,413,884 A | 5/1995 | Koch et al. | |
| 5,585,648 A | 12/1996 | Tischler | |
| 5,828,684 A | 10/1998 | Van de Walle | |
| 5,909,306 A | 6/1999 | Goldberg et al. | |
| 5,949,804 A | 9/1999 | Okazaki | |
| 6,014,388 A | 1/2000 | Fukunaga | |

FOREIGN PATENT DOCUMENTS

| | | |
|---|---|---|
| JP | 11-206817 | 8/1999 |
| JP | 11-257529 | 9/1999 |
| WO | WO-90/12387 | 10/1990 |

Primary Examiner—Hung X. Dang
(74) Attorney, Agent, or Firm—Sughrue Mion, PLLC

(57) ABSTRACT

A color laser display apparatus which contains a laser light source which emits ultraviolet laser light, a modulation unit which modulates the ultraviolet laser light, a display unit which includes a fluorescent screen, and a scanning unit which two-dimensionally scans the fluorescent screen with the ultraviolet laser light. The fluorescent screen includes, for each pixel, red fluorescent material which emits red light in response to the ultraviolet laser light, green fluorescent material which emits green light in response to the ultraviolet laser light, and blue fluorescent material which emits blue light in response to the ultraviolet laser light. The laser light source may be, for example, a semiconductor laser or a fiber laser.

19 Claims, 17 Drawing Sheets

F I G . 1
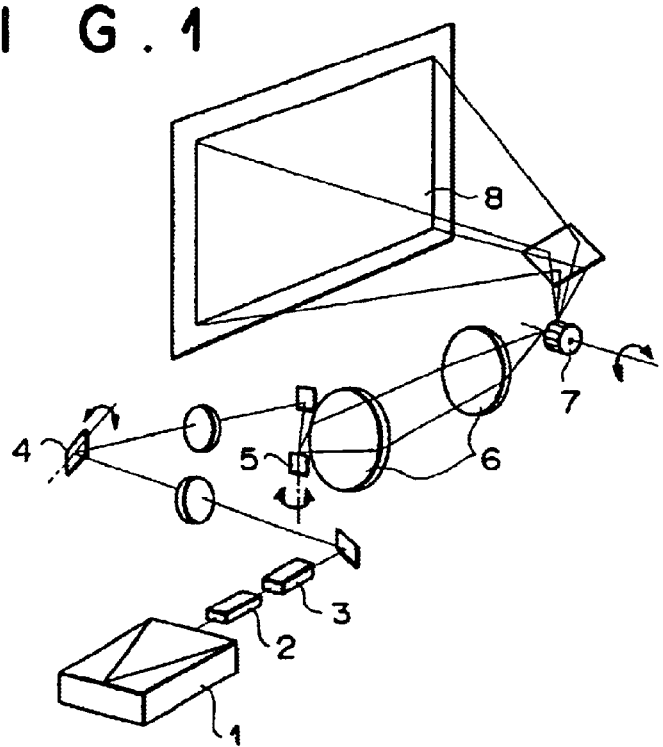
F I G . 2
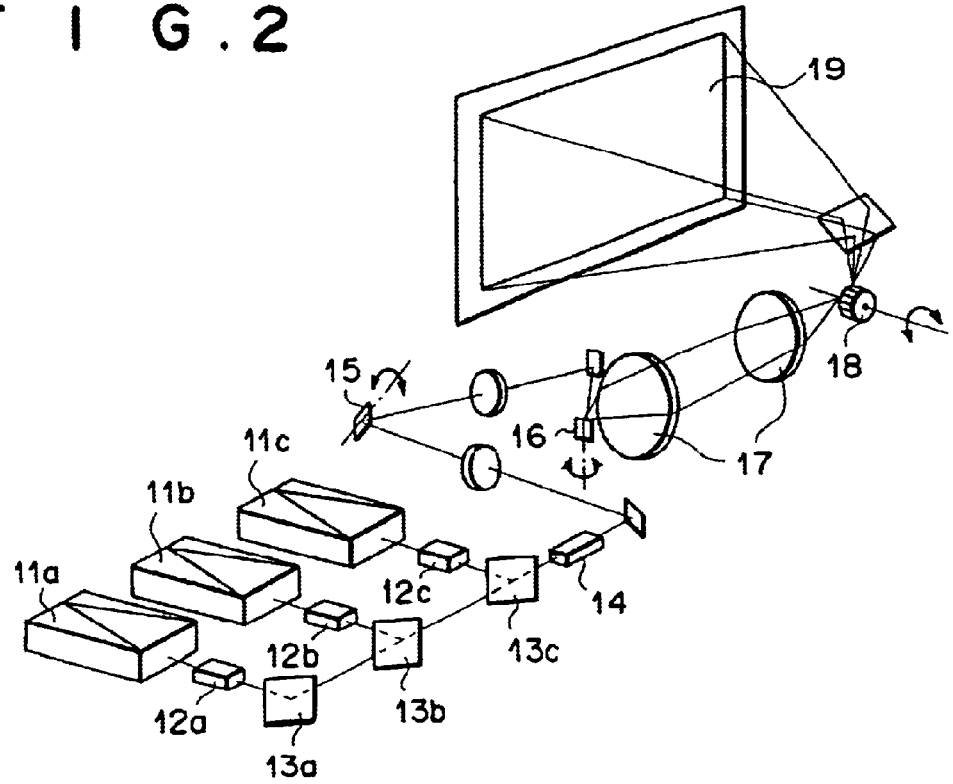

COLOR LASER DISPLAY APPARATUS HAVING FLUORESCENT SCREEN SCANNED WITH MODULATED ULTRAVIOLET LASER LIGHT

This application is a CIP of Ser. No. 09/519,681 filed Mar. 6, 2000 now abandoned.

BACKGROUND OF THE INVENTION

1. Field of the Invention

The present invention relates to a color laser display apparatus having a fluorescent screen scanned with laser light.

2. Description of the Related Art

High-power laser light sources having output power in the order of watts are needed for increasing luminosity of color laser display apparatuses. Conventionally, high-power $Ar^+$ gas lasers or $Kr^+$ gas lasers have been used as the laser light sources in the color laser display apparatuses. However, the laser light sources using gas lasers have low energy conversion efficiency, which is typically 0.1%, and require a water cooling system. In addition, the size and cost of the laser light sources using the gas lasers are great.

As reported in Laser Focus World (December 1997) p.52, recently, laser-diode-excited SHG solid-state lasers have been used as a short-wavelength visible laser light source. For example, SHG solid-state lasers which emit laser light of a green wavelength of 532 nm have higher energy conversion efficiency than those of the gas lasers, where YAG lasers which emit laser light having a wavelength of 1,064 nm are used in the SHG solid-state lasers.

However, in the above SHG solid-state lasers, the excitation laser light is visible to human eyes. Therefore, color purity of the display is affected by the excitation laser light.

In addition, in the laser-diode-excited SHG solid-state lasers, a kind of noise, called longitudinal mode competition, occurs when the output power is increased. For example, Laser Focus World (May 1998) p.243 reports that red solid-state lasers generate as much as 50% noise while noise generated in blue or green solid-state lasers generate is less than 3%. In order to control the longitudinal mode, an etalon may be used as a wavelength selection element. However, if single-mode oscillation is realized by using an etalon, large energy loss occurs. Therefore, it is impossible to obtain high power output and high luminosity.

As described above, when the above laser-diode-excited SHG solid-state lasers are used as a laser light source in the color laser display apparatuses, the improvement is made in the size and the energy conversion efficiency. However, there are still problems of performance and cost.

SUMMARY OF THE INVENTION

The first object of the present invention is to provide a color laser display apparatus in which color purity of the display is not affected by the excitation laser light.

The second object of the present invention is to provide a downsized, low noise, highly efficient color laser display apparatus.

According to the present invention, there is provided a color laser display apparatus which contains a laser light source which emits ultraviolet laser light, a modulation unit which modulates the ultraviolet laser light, a display unit which includes a fluorescent screen, and a scanning unit which two-dimensionally scans the fluorescent screen with the ultraviolet laser light. The fluorescent screen includes, for each pixel, red fluorescent material which emits red light in response to the ultraviolet laser light, green fluorescent material which emits green light in response to the ultraviolet laser light, and blue fluorescent material which emits blue light in response to the ultraviolet laser light.

That is, in the color laser display apparatus according to the present invention, a color image is displayed by scanning the fluorescent screen with the ultraviolet laser light generated by the ultraviolet laser light source, and the three primary colors can be generated with only one ultraviolet laser light beam by the red, green, and fluorescent materials arranged at positions of each pixel on the fluorescent screen. Therefore, reliability is increased, and cost can be decreased.

In addition, since the excitation laser light is ultraviolet laser light, the human eyes are substantially insensible to the excitation laser light. Therefore, color purity of the display is not affected by the excitation laser light.

The color laser display apparatus according to the present invention may have the following additional features.

(1) The laser light source may be a semiconductor laser device. In this case, the water cooling system, which is required when the gas laser is used as the laser light source, is unnecessary, and therefore the size of the color laser display apparatus can be reduced. In addition, a modulated light can be obtained by direct modulation in the semiconductor laser device.

(2) The above semiconductor laser device may have an active layer made of a GaN material, where the GaN material may be any semiconductor material which contains both gallium and nitrogen as at least a portion of their constituent elements. The GaN material may be, for example, GaN, $In_xGa_{1-x}N$, $GaN_yAs_{1-y}$, $In_xGa_{1-x}N_yAs_{1-y}$, or $Al_xGa_{1-x}N$, where $0<x<1$, and $0<y<1$. When the laser light source is realized by a semiconductor laser device which has an active layer made of a GaN material, a wavelength conversion element is unnecessary, and therefore the noise due to the longitudinal mode competition is not generated. Thus, the amount of noise can be reduced to less than 1%.

(3) The above semiconductor laser device having an active layer made of a GaN material may be one of a tapered-amplifier type, an α-DFB (Distributed Feedback) type, a phase-synchronization array type, and a surface emitting type. In this case, a sufficient amount of fluorescent light can be generated, and therefore an image can be displayed with high luminosity.

(4) The laser light source may be a laser device including a semiconductor laser device which has an active layer made of a GaN material so as to emit excitation laser light, and a surface emitting semiconductor laser device which has an active layer made of a GaN material and formed on a substrate. The surface emitting semiconductor laser device is excited by the excitation laser light to emit the ultraviolet laser light. In this case, the laser light source can emit ultraviolet laser light having high intensity, and therefore an image of high luminosity can be displayed. Preferably, the wavelength of the ultraviolet laser light is in the range from 380 nm to 420 nm.

(5) The laser light source may be a fiber laser device including an excitation light source, an optical fiber, and a wavelength conversion element. The excitation light source emits excitation light. The optical fiber is doped with at least one rare earth element which emits a laser beam when excited by the excitation light, and the at least one rare earth element includes $Pr^{3+}$. The wavelength conversion element converts the laser beam into the ultraviolet laser light. In this case, high output power can be obtained by the laser light source, and therefore the color laser display apparatus can display a color image with high luminosity.

The above fiber laser device may be a double-cladding fiber laser device which emits ultraviolet laser light having a wavelength of 360 nm. In this case, output power in the order of 10 watts can be achieved in the laser light source.

(6) The red fluorescent material may be ZnCdS:Ag, the green fluorescent material may be ZnS:Cu, and the blue fluorescent material may be ZnS:Ag.

DESCRIPTION OF THE DRAWINGS

FIG. 1 is a diagram illustrating the construction of the color laser display apparatus as the first embodiment of the present invention.

FIG. 2 is a diagram illustrating the construction of the color laser display apparatus as the second embodiment of the present invention.

DESCRIPTION OF PREFERRED EMBODIMENTS

Figure 3:
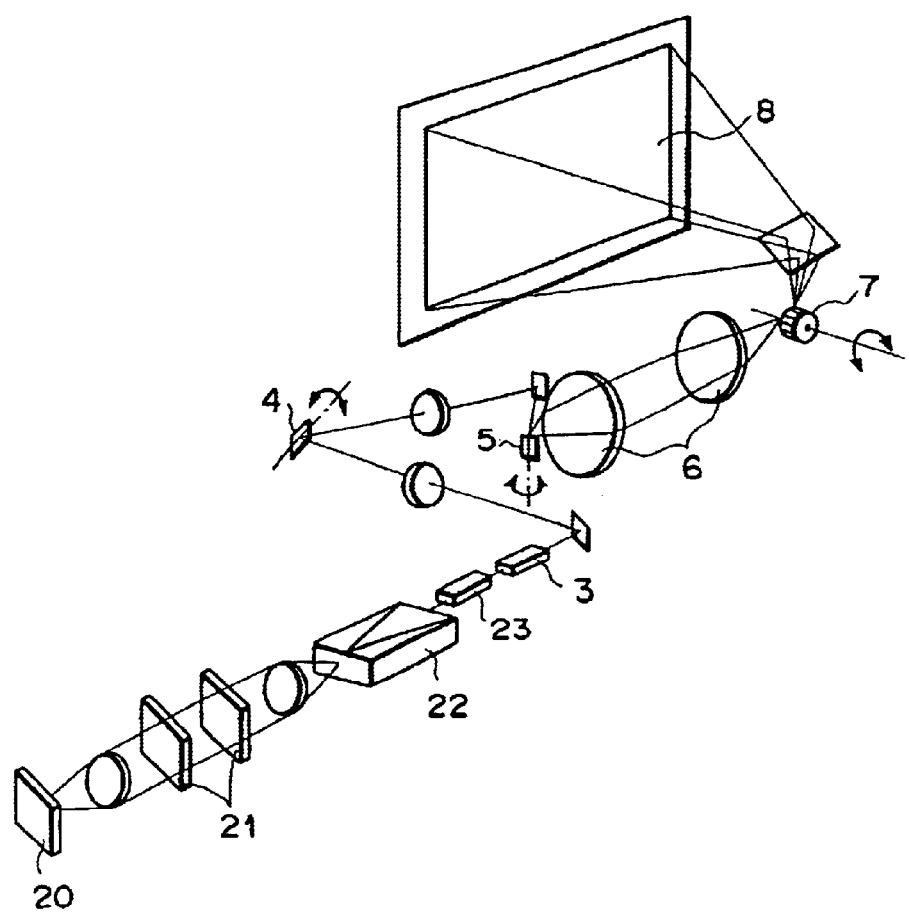
FIG. 3 is a diagram illustrating the construction of the color laser display apparatus as the third embodiment of the present invention.

Embodiments of the present invention are explained in detail below with reference to drawings.

First Embodiment

FIG. 1 is a diagram illustrating the construction of the color laser display apparatus as the first embodiment of the present invention. In the construction of FIG. 1, 1 denotes a semiconductor laser device, 2 denotes a modulator, 3 denotes an electrooptic deflector, 4 denotes a wobbling galvanometer, 5 denotes a galvanometer for vertical deflection (sub-scanning), 6 denotes relay lenses, 7 denotes a polygon mirror, and 8 denotes a screen.

The semiconductor laser device 1 is a GaN semiconductor laser device of a tapered-amplifier type having an output of three watts. The semiconductor laser device 1 functions as the aforementioned laser light source, and emits ultraviolet laser light. The intensity of the ultraviolet laser light is modulated by the modulator 2. The electrooptic deflector 3 is provided for correcting irregularity in the raster scan pitch. The galvanometers 4 and 5 are provided for deflecting the ultraviolet laser light in the vertical direction to realize sub-scanning. The relay lenses 6 are provided for condensing and relaying the ultraviolet laser light. The polygon mirror 7 is provided for deflecting the ultraviolet laser light in the horizontal direction to realize main scanning. Red, green, and blue fluorescent materials are arranged in predetermined positions for each pixel on the screen 8. The red, green, and blue fluorescent materials are ZnCdS:Ag, ZnS:Cu, and ZnS:Ag, respectively.

The composition of the active layer of the semiconductor laser device is adjusted so that the wavelength of the excitation laser light does not exceed 420 nm. Thus, the human eyes are substantially insensible to the excitation laser light. In the case where the active layer of the semiconductor laser device is made of an InGaN material, the wavelength of the excitation laser light does not exceed 420 nm, for example, when the composition of the active layer of the semiconductor laser device is adjusted to be $In_xGa_{1-x}N$ ($0<x<0.2$). In addition, the excitation laser light having a wavelength which does not exceed 420 nm can also be obtained in the case where the active layer of the semiconductor laser device is made of a GaN material.

Thus, the construction of FIG. 1 realizes the aforementioned color laser display apparatus according to the present invention.

Second Embodiment

FIG. 2 is a diagram illustrating the construction of the color laser display apparatus as the second embodiment of the present invention. In the construction of FIG. 1, 11a, 11b, and 11c each denote a semiconductor laser device, 12a, 12b, and 12c each denote a modulator, 13a, 13b, and 13c each denote a dichroic mirror, 14 denotes an electrooptic deflector, 15 denotes a wobbling galvanometer, 16 denotes a galvanometer for vertical deflection (sub-scanning), 17 denotes relay lenses, 18 denotes a polygon mirror, and 19 denotes a screen.

The three GaN semiconductor laser devices 11a, 11b, and 11c are provided for emitting three ultraviolet laser light beams corresponding to the three primary colors (red, green, and blue), respectively. Each of the semiconductor laser devices 11a, 11b, and 11c is a semiconductor laser device of a tapered-amplifier type having an output of three watts. The three modulators 12a, 12b, and 12c are provided for modulating intensities of the ultraviolet laser light beams emitted from the three semiconductor laser devices 11a, 11b, and 11c, respectively. The dichroic mirrors 13a, 13b, and 13c are provided for mixing the modulated ultraviolet laser light beams by passing through and/or reflecting the modulated ultraviolet laser light beams. Similar to the first embodiment, the electrooptic deflector 14 is provided for correcting irregularity in the raster scan pitch. The galvanometers 15 and 16 are provided for deflecting the ultraviolet laser light beams in the vertical direction to realize sub-scanning. The relay lenses 17 are provided for condensing and relaying the ultraviolet laser light beams. The polygon mirror 18 is provided for deflecting the ultraviolet laser light in the horizontal direction to realize main scanning. Red, green, and blue fluorescent materials are arranged in predetermined positions for each pixel on the screen 19. The red, green, and blue fluorescent materials are ZnCdS:Ag, ZnS:Cu, and ZnS:Ag, respectively.

The compositions of the active layers of the semiconductor laser devices are adjusted so that the wavelength of the excitation laser light does not exceed 420 nm, as explained for the first embodiment.

Thus, the construction of FIG. 2 also realizes the aforementioned color laser display apparatus according to the present invention.

Third Embodiment

FIG. 3 is a diagram illustrating the construction of the color laser display apparatus as the third embodiment of the present invention. In the construction of FIG. 3, reference number 20 denotes a mirror, 21 denotes a Lyot filter, 22 denotes a semiconductor laser device, and 23 denotes a modulator. In FIG. 3, elements having the same reference numbers as FIG. 1 have the same function as the corresponding elements in FIG. 1.

The semiconductor laser device 22 is a semiconductor laser device of a tapered amplifier type having an output of three watts. The semiconductor laser device 22 is provided with the Lyot filter 21 and the mirror 20. A laser light beam emitted from one end of the semiconductor laser device 22 is reflected by the mirror 20, and returns to the semiconductor laser device 22 through the Lyot filter 21, which is provided for reducing the width of the oscillation wavelength distribution of the laser light beam to 0.01 μm before the laser light beam returns to the semiconductor laser device 22. A semiconductor laser device provided with a Lyot filter and a mirror is disclosed in Japanese Unexamined Patent Publication No. 10 (1998)-190105, which is assigned to the present assignee, and the contents of which are incorporated into this specification by reference.

After the laser light beam exits from the other end of the semiconductor laser device 22, the intensity of the ultraviolet laser light is modulated by the modulator 23. Thereafter, the modulated laser light beam is lead to the screen 8 for scanning the screen 8 in the same manner as the first embodiment.

The composition of the active layer of the semiconductor laser device is adjusted so that the wavelength of the excitation laser light does not exceed 420 nm, as explained for the first embodiment.

Thus, the construction of FIG. 3 realizes the aforementioned color laser display apparatus according to the present invention.

As mentioned above, due to the use of the Lyot filter 21, the width of the oscillation wavelength distribution of the laser light beam is reduced to 0.01 μm, which is one tenth of the conventional width. In addition, since the transmittance of the Lyot filter 21 is 99%, energy conversion efficiency and output power can be increased by the use of the Lyot filter 21, and therefore luminosity of the displayed image can be further increased.

Variations and other Matters

The following variations may be made in the first to third embodiments.

(1) Instead of the electrooptic deflectors, an inclination correction optical system using a cylindrical lens may be used for correcting irregularity in the raster scan pitch.

(2) The modulators may be an acoustooptic modulator (AOM) or an eletrooptic modulator (EOM). Instead of using modulators, the modulation may be performed directly in the semiconductor laser device per se.

(3) The fluorescent materials arranged on the screens may be inorganic materials or organic materials. As inorganic materials, the aforementioned ZnS and ZnCdS materials or $Y_2O_2S$ materials may be used. As organic materials, courmarine 6 may be used.

(4) The laser light sources may be a fiber laser device containing an optical fiber doped with at least one rare earth element including $Pr^{3+}$, and a wavelength conversion element which converts a laser beam generated by the optical fiber into the ultraviolet laser light, where the wavelength of the ultraviolet laser light is 360 nm. Such a fiber laser device is disclosed in Japanese patent application No. 11(1999)-206817, the contents of which are incorporated into this specification by reference.

(5) The laser light source may be an ultraviolet laser device including a semiconductor laser device which has an active layer made of a GaN material so as to emit excitation laser light, and a surface emitting semiconductor laser device which has an active layer made of a GaN material and formed on a substrate. The surface emitting semiconductor laser device is excited by the excitation laser light to emit the ultraviolet laser light, and the wavelength of the ultraviolet laser light is in the range from 380 nm to 420 nm. Such an ultraviolet laser device is disclosed in Japanese patent application No. 11(1999)-257529, the contents of which are incorporated into this specification by reference.

(6) In addition, all of the contents of the Japanese patent applications, Nos. 11(1999)-57187 and 11(1999)-357440 are incorporated into this specification by reference.

Figure 4:
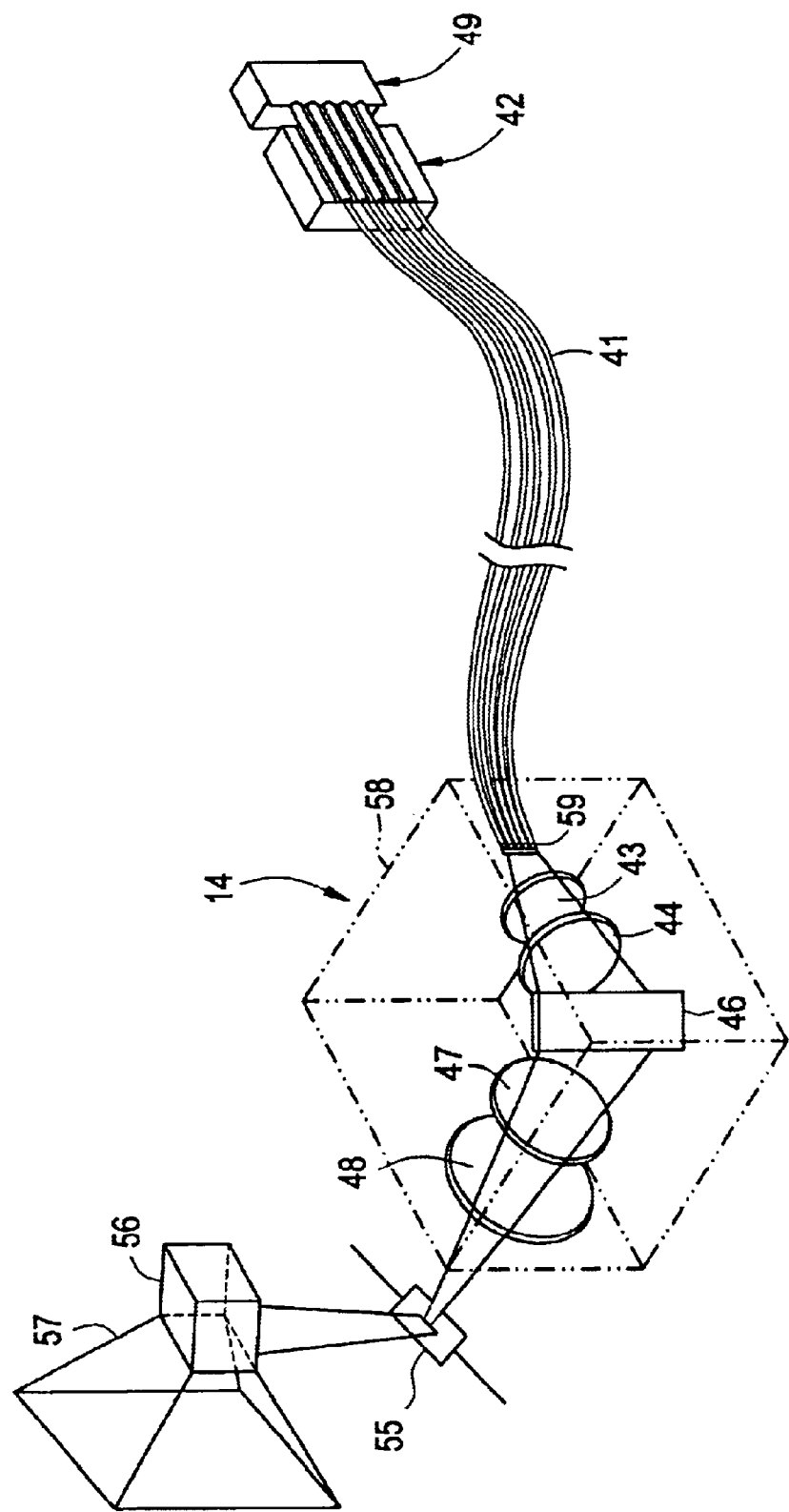
FIG. 4 is a diagram illustrating the construction of the color laser display apparatus according to the fourth embodiment of the present invention.

FIG. 4 shows a color laser display according to a fourth embodiment of the present invention.

This color laser display comprises: a high output laser light source 42; lenses 43 and 44 that converges the laser light input from laser light source 42 into a line form; a optical modulating array element 46 that modulates said laser light per pixel according to image data 38; optical systems 47 and 48 that form said modulated laser light into an image on a galvano mirror 55; and an optical system 56 that projects the image, deflected by said galvano mirror 55, onto a screen 57.

As shown in FIG. 4, the laser light source 42, which is the fundamental light source, consists of a laser portion 49 that includes semiconductor lasers, and multimode fibers 41 that are optically coupled with each of said semiconductor lasers. In order to emit the laser light linearly extending in a lengthwise direction of the optical modulating array element 46, which is formed in an elongated manner, a plurality (for example, 100-however, only 5 are shown in the figure) of said multimode fibers are arranged along the lengthwise direction of said optical modulating array element 46. The detailed construction of the laser light source 42 will be described later.

Laser light source 42, lenses 43 and 44, optical modulating array element 46, as well as image forming optical systems 47 and 48 are fixed to a casing 58 by a fixing member (not shown). The lens 48 is supported by a guide (not shown) to be movable along the optical axis. Each of the laser light source 42 and the optical modulating array element 46 are connected to a controller (not shown) via a driver (not shown) that controls them.

Figure 5:
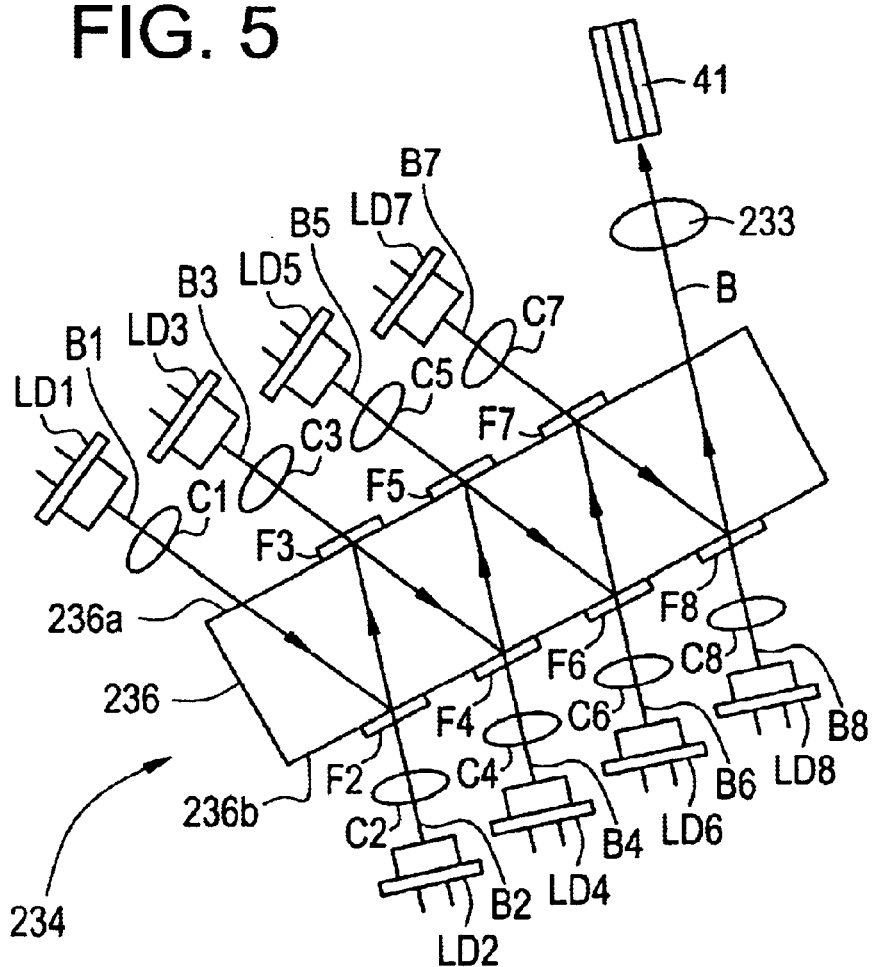
FIG. 5 is a plan view illustrating the laser light source of the exposure apparatus associated with the fourth embodiment of the present invention.

As the laser light source 42, a laser light source comprising a gallium nitride semiconductor laser coupled to a fiber as disclosed in Japanese Patent Application 2001-273870 may be employed, for example. This laser, as shown in FIG. 5, is constituted by, for example, eight multimode gallium nitride (GaN) semiconductor lasers LD1, LD2, LD3, LD4, LD5, LD6, LD7, as well as LD8, and a wave multiplexing optical system 234. The emission wavelengths of the GaN semiconductor lasers LD1–LD8 are wavelengths capable of being emitted at high output selected from within a range of capable emission, which is 390–410 nm. For example, the wavelengths may be set at 395 nm, 396 nm, 397 nm, 398 nm, 399 nm, 400 nm, 401 nm, and 402 nm respectively, differing by one nm each. At this time, every laser's output is set at a common value of 100 mW.

Collimating lenses C1–C8, corresponding to each of the GaN semiconductor lasers L1–L8, are provided to collimate the diffuse laser beams B1–B8 emitted therefrom.

Figure 7:
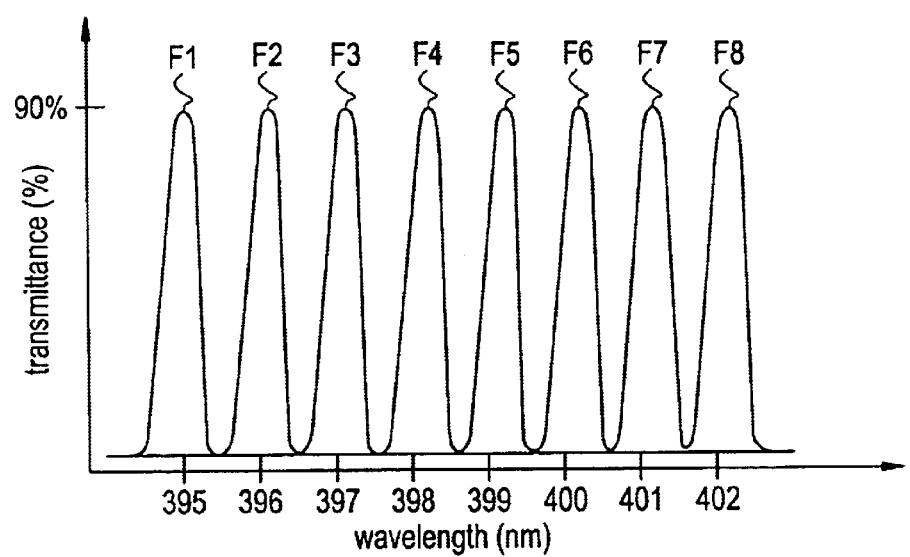
FIG. 7 is a graph illustrating the transmittance characteristics of the narrow bandwidth band pass filters of the laser light source illustrated in FIG. 5.

The wave multiplexing optical system 234 consists of a plane parallel prism 236, narrow bandwidth band pass filters F3, F5, and F7 adhesively attached to one surface 236a thereof, and narrow bandwidth band pass filters F2, F4, F6, and F8 adhesively attached to an opposite surface 236b thereof. Each of these narrow bandwidth band pass filters F2–F8 are formed to reflect light incident on the adhesive surfaces thereof, adhered to the surfaces 236a and 236b of plane parallel prism 236 at a reflectance rate of, for example, 98%. Light of a predetermined wavelength range that is incident on a surface opposite to the adhesive surface is to be transmitted at a transmittance rate of, for example, 90%. The transmittance spectra of these narrow bandwidth band pass filters F2–F8 are shown in FIG. 7, along with the transmittance spectrum of a narrow bandwidth band pass filter F1, to be described later.

Figure 6:
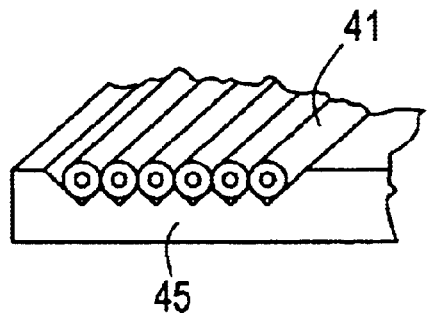
FIG. 6 is a plan view illustrating the terminal surfaces of the multimode fibers which have been arranged in an array form according to the fourth embodiment of the present invention.

Each of the GaN semiconductor lasers LD1–LD8 are arranged so that each of the laser beams B1–B8 respectively emitted therefrom are incident on the narrow bandwidth band pass filters F2–F8 at an angle of incidence of 5°. The laser beams B1–B8 emitted from each of the GaN semiconductor lasers LD1–LD8 at wavelengths of 395 nm, 396 nm, 397 nm, 398 nm, 399 nm, 400 nm, 401 nm, and 402 nm, respectively, after entering the plane parallel prism 236, are multiplexed into a single beam while being reflected by the narrow bandwidth band pass filters F2–F8. This multiple wavelength high output (for example, approximately 0.5W) laser beam B is emitted from the plane parallel prism 236, focused by a lens 233, and enters the multimode fiber 41, having a core diameter of approximately 10 μm and an NA of 0.3. By arranging the output faces of the multimode fibers 41 in an array as shown in FIG. 6, for example, each of the multimode fibers 41 is positioned in respective one of grooves, which are formed in a fiber holder 45 in the manner such that they extend parallel to the direction in which the beam is emitted and a 50W linear beam may be obtained by arraying 100 of these multimode fibers 41. Note that, as shown in FIG. 4, the laser portion 49, which includes the GaN semiconductor lasers LD1–LD8, the plane parallel prism 236 as well as the lens 233 is provided externally to a casing 58 of an exposure head 14.

Figure 8:
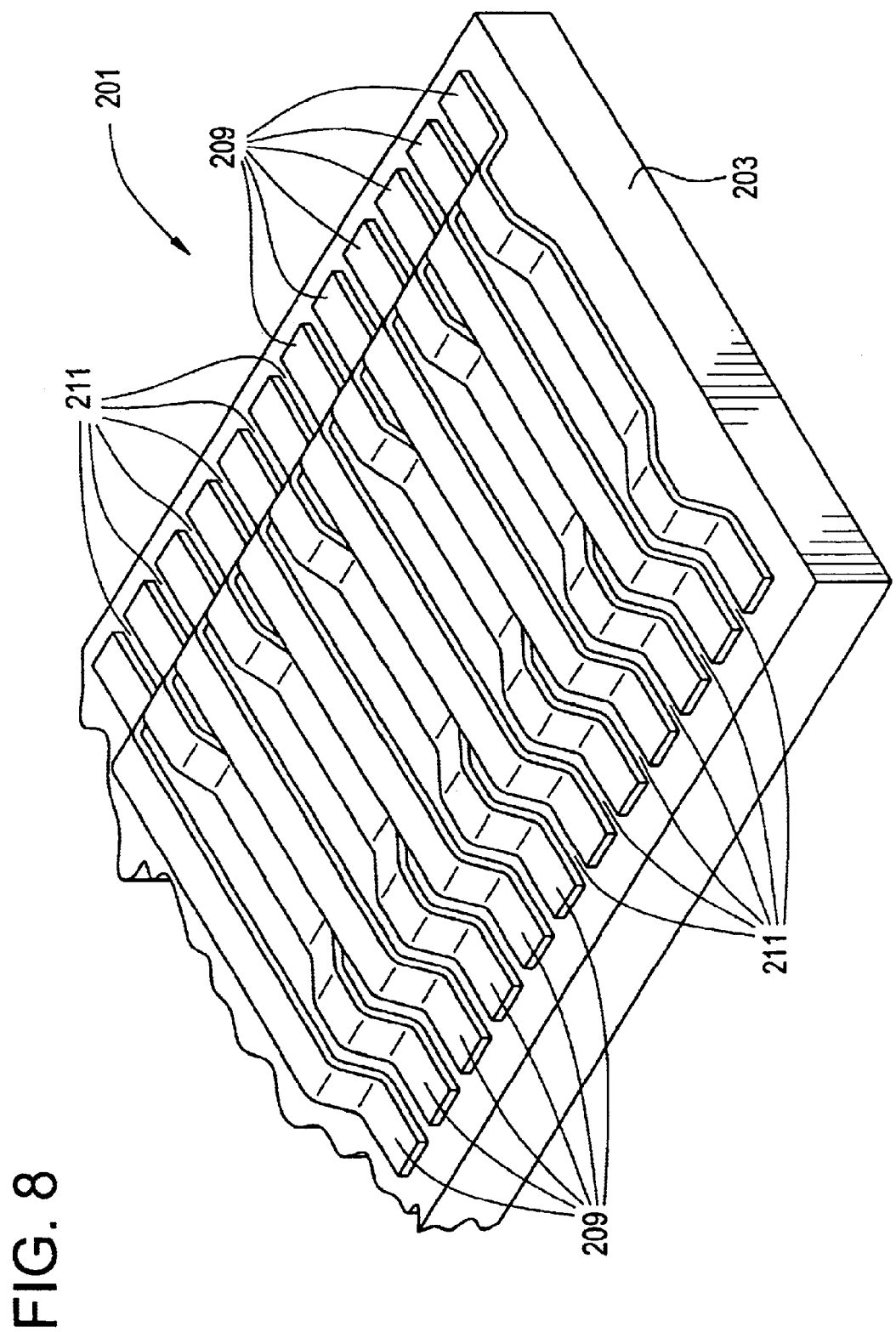
FIG. 8 is a perspective view illustrating the construction of the grating light valve element (GLV element) employed as the optical modulating array element.
Figure 9A:
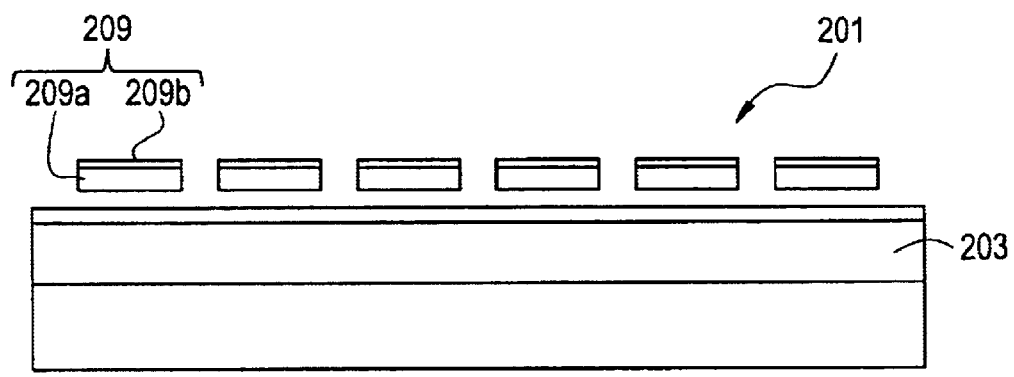
FIG. 9A and FIG. 9B are diagrams illustrating the operational principles of the GLV element.
Figure 9B:
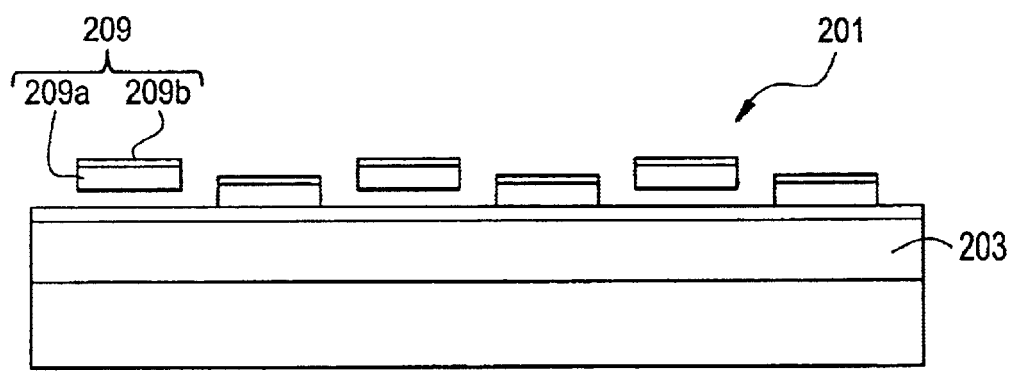

Next, with reference to FIG. 8 and FIG. 9, the construction and operational principle of a CLV (Grating Light Valve) element that is to be employed as the optical modulating array element 46. The GLV element 201 is an SLM (Spatial Light Modulator) of a MEMS (Micro Electro Mechanical Systems) type, as disclosed in U.S. Pat. No. 5,311,360, for example. As shown in FIG. 8, the GLV element 201 is constituted of a plurality of unidirectionally arranged gratings.

As shown in FIG. 8, a plurality (for example, 6,480) of ribbon-form micro bridges 209 that act as movable gratings is provided on a substrate 203, formed of silicon or the like, of the GLV element 201. A plurality of slits 211 is formed by the parallel arrangement of the micro bridges 209. The micro bridges 209 are maintained at a predetermined distance from the substrate 203.

As shown in FIG. 9, the bottom surface of the micro bridge 209, that is, the surface that faces the substrate 203, is constituted of a flexible beam 209a of SiNx or the like. The top surface is constituted of a reflective electrode film 209b of a single layer metallic film of aluminum (or gold, silver, copper and the like). By forming the reflective electrode layer with gold, silver, copper or the like, reflectivity can be improved according to the wavelength of light utilized. The substrate 203, the micro bridges 209 and a controller (not shown) constitute the movable grating drive means.

The driving of the GLV element 201 is controlled by the on/off state of a voltage applied between the micro bridges 209 and the substrate 203. If the voltage applied between the micro bridge 209 and the substrate 203 is turned on, static electric attraction is generated therebetween by an inducted static electric charge, and the micro bridge 209 bend towards the substrate 203. When the applied voltage is turned off, the bend is released, and the micro bridge 209 elastically returns to the predetermined distance away from the substrate at which it is maintained. Generally, one pixel is constituted by a plurality (for example, six) micro bridges 209, and by alternately positioning a micro bridge 209 to have a voltage applied thereto, the applied voltage creates a diffraction grating, thereby performing optical modulation.

In the case that a voltage is not applied to the micro bridges 209, all of the reflective surfaces thereof are matched in height, and no optical path difference arises in a light reflected thereby. On the other hand, if a voltage is applied to every other micro bridge 209, by the principle described above, the central portions of said micro bridges bend, and a reflective surface becomes alternately stepped. If a laser light is incident on this reflective surface, an optical path difference arises in the light reflected by the unbent micro bridges 209, and a diffraction phenomenon of the light occurs. The intensity of the primary diffracted light first depends on the optical path difference, and may be expressed by the equation below. In this case, the intensity of the diffracted light is maximal when the optical path difference is λ/2.

$$I_{1st} = I_{max} \sin(2\pi d/\lambda) \qquad \text{Equation 1}$$

Next, the operation of the color display of the present embodiment will be described. In order to display an image on screen 57, a laser light is two dimensionally scanned on the screen 57 comprising a plurality of pixels, each having R(red), G(green), and B(blue) fluorescent materials. Image data 38 is input into the controller (not shown) of the optical modulating array element 46, and is recorded in a frame memory in said controller. This image data represents the density of each of the pixels that constitute the image. The linear beam emitted from laser light source 42 and extending in a lengthwise direction of the optical modulating array element 46 is irradiated linearly onto said elongated optical modulation array element 46, and is simultaneously modulated thereby. Thereafter, the aforementioned linear light is caused to scan an area two dimensionally by a deflection device such as the galvano mirror 55. Then, the image is projected onto the screen 57 by a projection optical system 56. In this manner, the laser light two dimensionally scans and projects the fluorescent materials on the screen, thereby showing an image on the screen.

Figure 12:
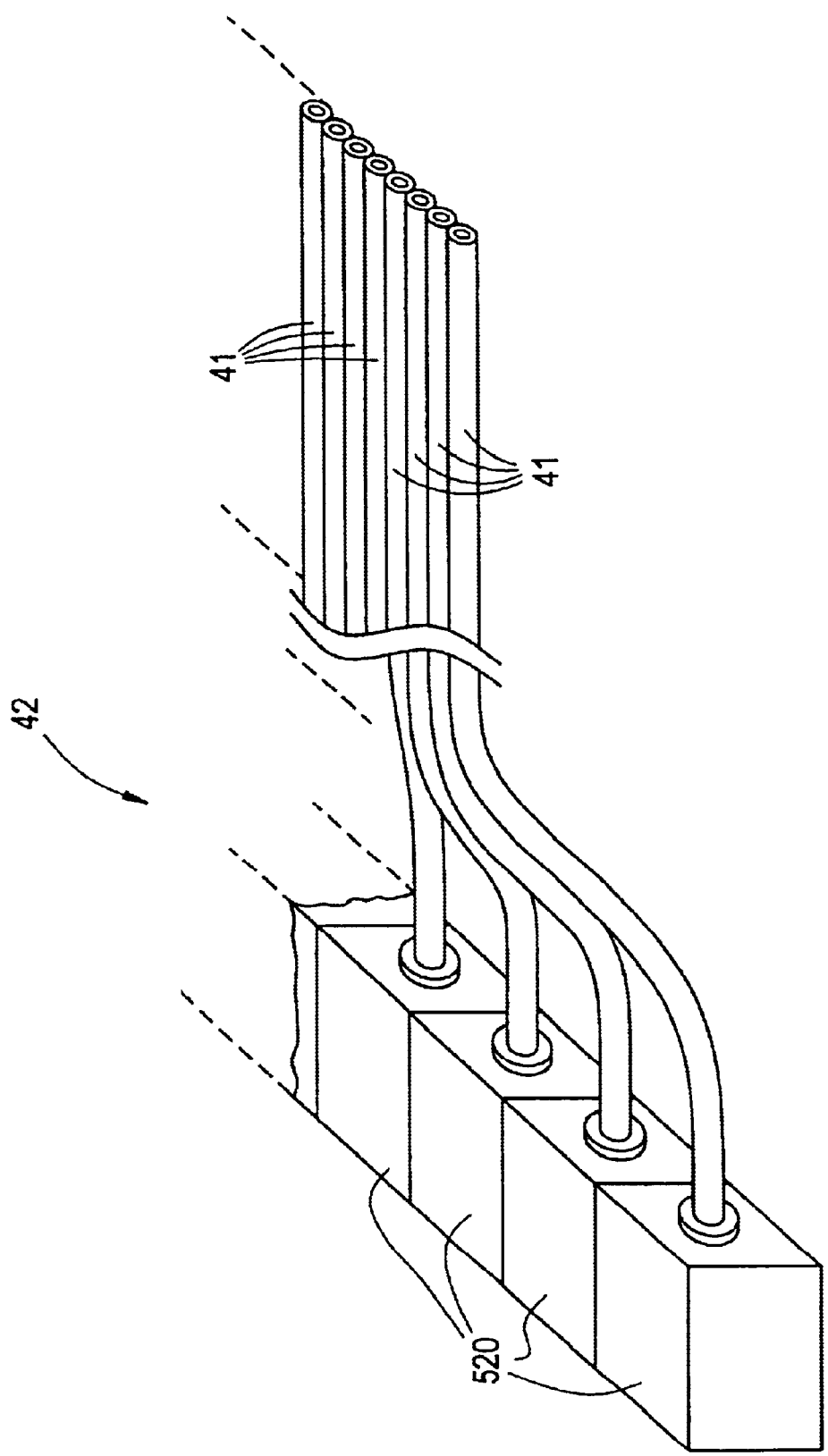
FIG. 12 is a perspective view illustrating the light source employed in the fifth embodiment of the present invention.

Next, a color laser display according to a fifth embodiment will be described. This color laser display is of a similar construction to that of the fourth embodiment except that the laser light source 42 of the fourth embodiment has been replaced with a different laser light source to be described below. As this laser light source, one could be employed as disclosed in Japanese Patent Application 2001-273870 and Japanese Patent Application 2001-273871. This laser light source 42, as shown in FIG. 12, comprises: a plurality of wave multiplexing modules that multiplex beams emitted from a plurality of semiconductor laser chips into one fiber; and a plurality of optical fibers 41 that are optically coupled to each of said modules 520 and arranged in an array to emit a linear laser luminous flux. That is, the output face portions of the plurality of optical fibers 41 are bundled in an array form.

Figure 10:
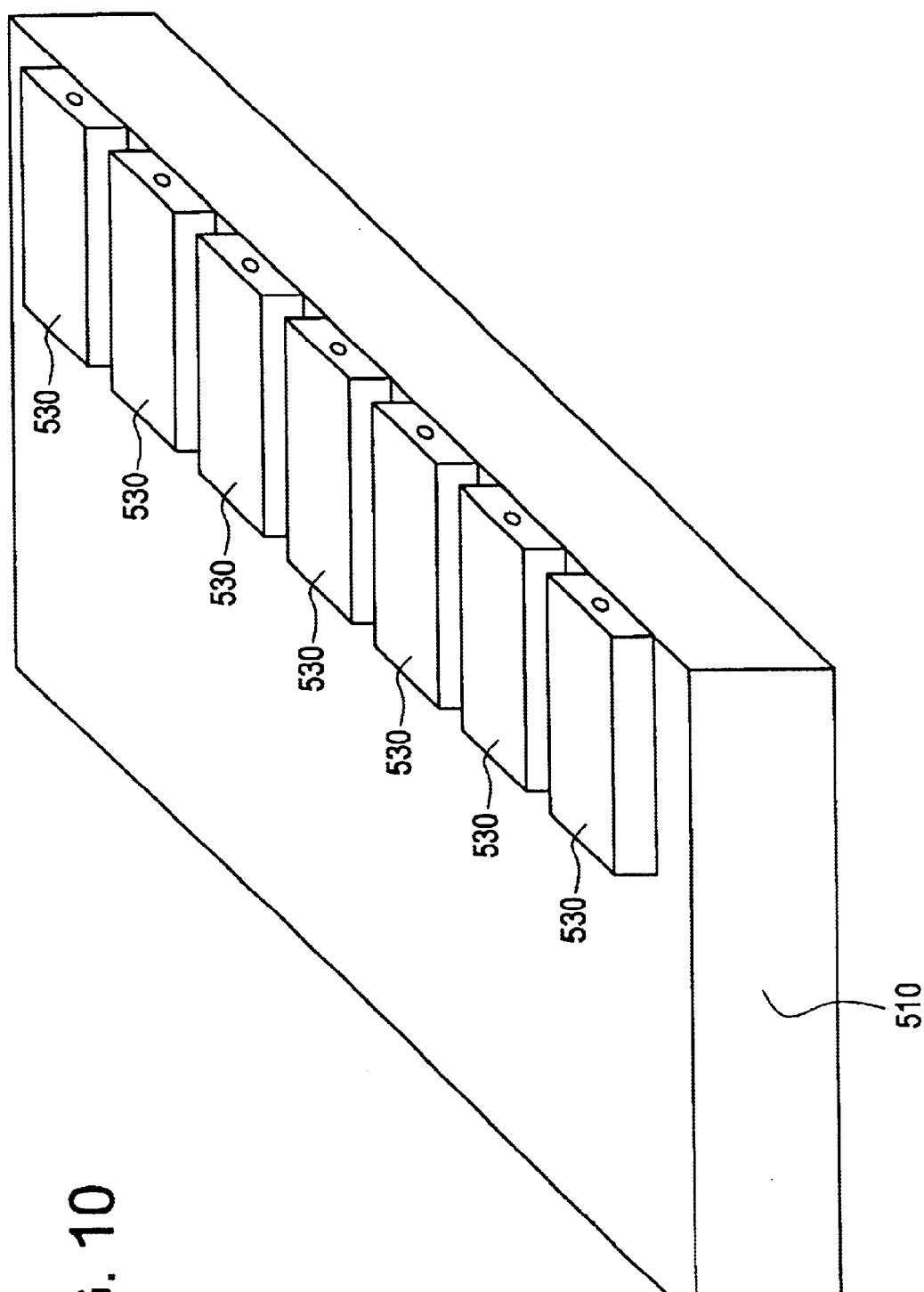
FIG. 10 is a perspective view illustrating the semiconductor laser chip which is the light source of the exposure apparatus associated with the fifth embodiment of the present invention.
Figure 11A:
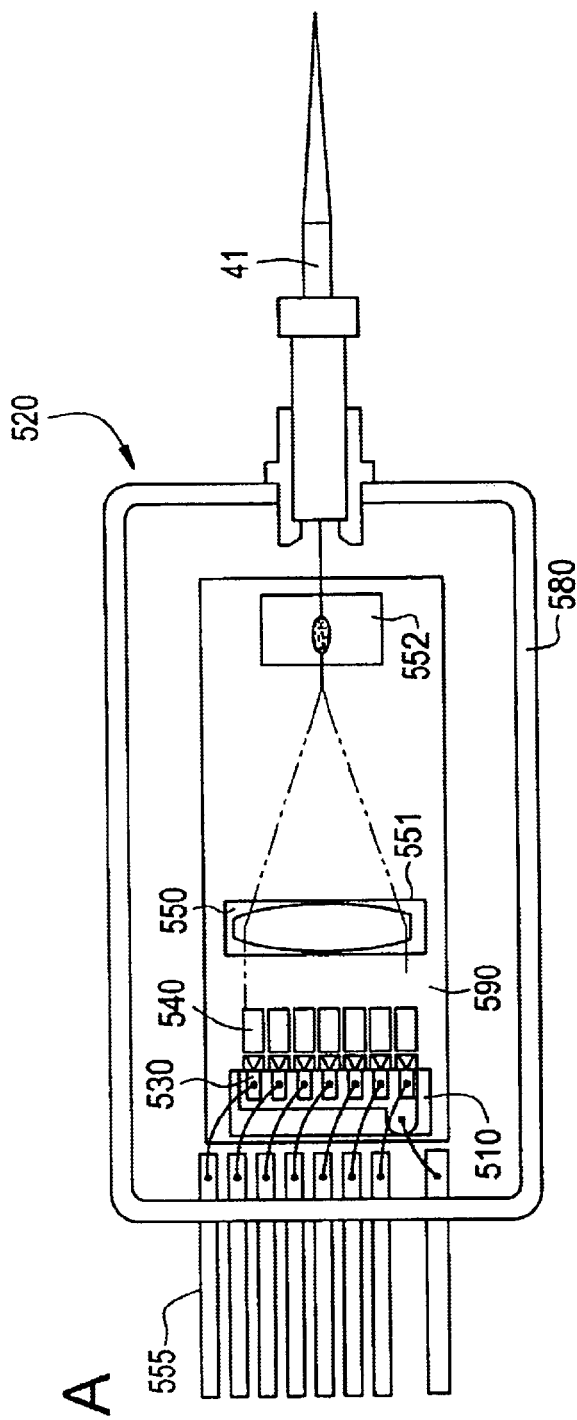
FIG. 11A is a plan view illustrating the semiconductor laser chip as the light source.
Figure 11B:
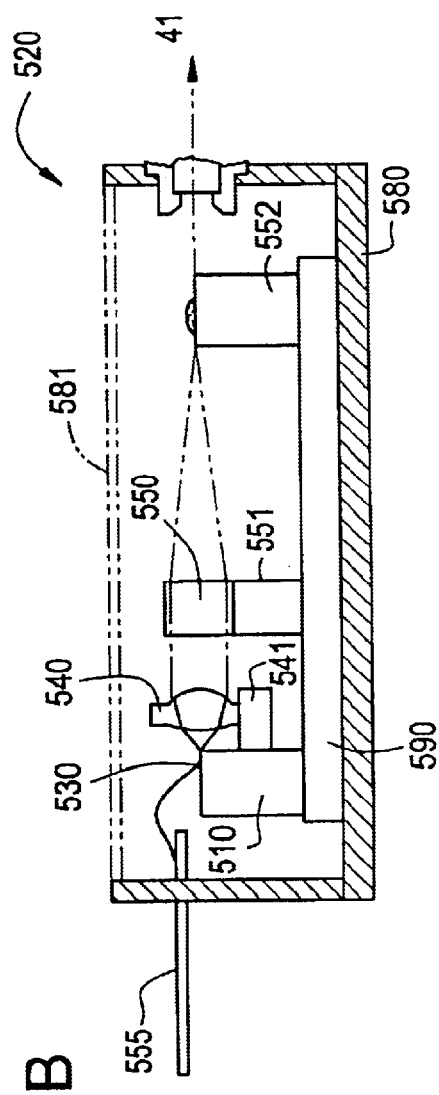
FIG. 11B is a sectional view taken along the optical axis of FIG. 11A.

Each of the wave multiplexing modules 520 are constructed of a plurality (for example, seven) of side multimode gallium nitride semiconductor lasers 530 fixedly arranged on a heat sink block 510 (made of copper, for example); a plurality of collimating lenses 540 facing each of the semiconductor lasers 530; and a focusing lens 550, and are optically coupled to a single multimode optical fiber 41, as shown in FIG. 10, FIG. 11a and FIG. 11b.

The heat sink block 510, the semiconductor lasers 530, the collimating lenses 540, as well as the focusing lens 550 are all housed in a box like package 580 having an open top. By the open top of package 580 being closed by a package lid 581, the aforementioned elements are held in the hermetically sealed space created by the package 580 and the package lid 581.

A base board 590 is fixed to the bottom surface of the package 580, the aforementioned heat sink block 510 is attached to the upper surface of the base board 590, and a collimating lens holder 541 that holds the collimating lenses 540 is fixed on the heat sink block 510. In addition, a focusing lens holder 551 that holds the focusing lens 550 and a fiber holder 552 that holds the input end portion of the multimode optical fiber 41 are fixed on the upper surface of the base board 590. Also, the wiring 555 that supplies a driving current to the gallium nitride semiconductor lasers 530 communicate with the outside of the package 580 through an aperture (not shown) in the side wall of the package 580, sealed with an airtight sealing material.

The collimating lenses 540 are formed so that the aperture diameter in a direction parallel to the row of emission points of the gallium nitride semiconductor lasers 530 is smaller than the aperture diameter in a direction perpendicular to said direction (that is, in a thin, long shape), and are closely arranged in the direction parallel to the aforementioned row of emission points. As the gallium nitride semiconductor lasers 530, those that possess an emission width of 2 $\mu$m, and spreading angles in a direction parallel to the active layer and perpendicular to the active layer of 10° and 30° respectively, may be employed. These gallium nitride semiconductor lasers 530 are provided so that their emission points line up in a single line in a direction parallel to the active layers thereof.

Accordingly, the laser beams emitted from each of the emission points are incident on each of the elongate collimating lenses 540 as described above in a state wherein the direction with the maximum spreading angle matches the direction of the greater aperture diameter, and the direction with the minimum spreading angle matches the direction of the lesser aperture diameter. That is, each of the elongate collimating lenses 540 are utilized with an extremely decreased ineffective portion corresponding to the oval sectional shape of the laser beam incident thereto.

For example, in the present embodiment, a collimating lens 540 having aperture diameters in the horizontal and vertical directions of 1.1 mm and 4.6 mm respectively, a focal distance of 3 mm, an NA of 0.6, and a laser beam to be incident thereto having a beam diameter in the horizontal and vertical directions of 0.9 mm and 2.6 mm respectively, may be utilized. In addition, the collimating lenses 540 are positioned with a pitch of 1.25 mm.

The focusing lens 550 is an elongate cutout of an area containing the optical axis of an aspherical lens, in a shape that is long in a direction of the row of the collimating lenses 540, that is, a horizontal direction, and short in a direction perpendicular thereto. As the focusing lens 550, that which has a focal distance of 12.5 mm and an NA of 0.3 may be employed. This focusing lens 550 is formed by, for example, molding resin or optical glass.

On the other hand, as the multimode optical fiber 41, one that is based on the graded index model manufactured by Mitsubishi Densen, wherein the center portion of the core is of a graded index form and the peripheral portion is of a step index form with a core diameter of 25 $\mu$m, an NA of 0.3, and a transmittance rate of 99.5% of the terminal face coating may be utilized. That is, the value of the core diameter X NA becomes 7.5 $\mu$m.

In the case that the coupling efficiency between the laser beams and the multimode optical fiber 41 is 0.9, the output of each of the gallium nitride semiconductor lasers 530 is 100 mW, and the number of the gallium nitride semiconductor lasers is 7, a multiplexed laser beam with an output of 630 mW (100 mW×0.9×7) will be obtained.

With regard to the gallium nitride semiconductor lasers 530, their emission wavelength is 405±10 nm, and their maximum output is 100 mW. The laser beams emitted from these gallium nitride semiconductor lasers 530 in a diffuse state are collimated by the collimating lenses 540, corresponding thereto. The collimated laser beams are focused by the focusing lens 550, and converge upon the input terminal face of the core of the multimode optical fiber 41.

The collimating lenses 540 and the focusing lens 550 constitute the focusing optical system, and that, in combination with the multimode fiber 41, constitute the wave multiplexing optical system. That is, the laser beams focused by the focusing lens 550 as described above enter the core of multimode optical fiber 41, propagate therethrough, are multiplexed into a single laser beam, and is emitted therefrom. In the case that an optical fiber of a step index form or one that possesses a high NA value is employed as the multimode optical fiber 41, those of a graded index form as well as combinations therewith are applicable.

Note that instead of separate collimating lenses 540 corresponding to each of the semiconductor lasers 530, a collimating lens array that has a number of lens elements that correspond to each of the semiconductor lasers 530 may be employed. In the case that separate collimating lenses 540 are employed, by arranging them close to each other and by decreasing the positioning pitch of the gallium nitride semiconductor lasers, space utilization efficiency can be improved. However, by utilizing a collimating lens array, said effect can be further heightened. In addition, if space utilization efficiency is improved in this manner, the number of laser beams to be multiplexed can be increased, and the requirement for positioning accuracy of the gallium nitride semiconductor laser 530, the focusing optical system as well as the multimode optical fiber 41 during assembly can be comparatively eased.

The focal distance and the numerical aperture of each of the lens elements of the collimating lens array, or of each separate collimating lens 540 is set to f1 and NA1, respectively. The focal distance of the focusing lens 550 is set to be f2, the numerical aperture of the multimode optical fiber 41 is set to NA2, and the space utilization efficiency rate is set to η. Note that this space utilization efficiency rate' η' is defined by the space occupied by the optical path of the laser beams in proportion to the space utilized by the laser beams, and η' is equal to one in a state in which the laser beams are directly adjacent to each other.

Under the conditions described above, the magnification α of a lens diameter, that is, the ratio between the diameter of a beam spot at each emission point of the gallium nitride semiconductor lasers and the diameter of a beam spot at the terminal face of the core of the multimode fiber 41, can be given by equation (1) below. Note that N is the number of laser beams to be multiplexed.

$$a = \frac{f_2}{f_1} = \frac{NA_1}{\left(\frac{NA_2}{N} \times \eta\right)} = \frac{NA_1}{NA_2} \times \frac{N}{\eta}$$

As is clear from equation (1), the magnification α' decreases as the space utilization efficiency rate η' increases. As the magnification α' decreases, the distance that the laser beam moves on the terminal face of the core of the multimode optical fiber 41 decreases in the case that there is a shift in the relative position between the gallium nitride semiconductor laser and the focusing optical system as well as the multimode optical fiber. Therefore, it becomes possible to make the laser beam incident on the core of the multimode optical fiber 41 correctly even if the positioning accuracy during assembly is relatively eased. In addition, as the value of η' is brought closer to one, α' may be decreased, and the number of laser beams to be multiplexed N may be increased for that amount. Therefore, high output is possible with a large allowance for positional shift, even if the number of lasers to be multiplexed N is increased.

In order to emit the laser light linearly extending in a lengthwise direction of the elongate optical modulating array element 46, the fibers 41, provided for each of the plurality of wave multiplexing modules 520 are arranged along the lengthwise direction of said optical modulating array element 46 in the form of an array.

As has been described above, the laser light emitted from each of the gallium nitride semiconductor lasers 530 enter the optical fiber 41 after being collimated by the collimating lens 540 that corresponds to each of said lasers 530. In the case that seven gallium nitride semiconductor lasers are provided in the wave multiplexing module 520, seven collimated laser beams are optically coupled to the fiber 41 by the aspheric lens 550. If 100 of these fibers, having a core diameter of 25 μm, an NA of 0.3, and an output of 0.5W, are provided, a 50W (0.5×100) linear super high output beam will be emitted from the linearly provided fibers. The linear beam is collimated in a direction indicated by the arrow Y while being converged in a direction perpendicular thereto, and enters the elongate optical modulation array.

Figure 13A:
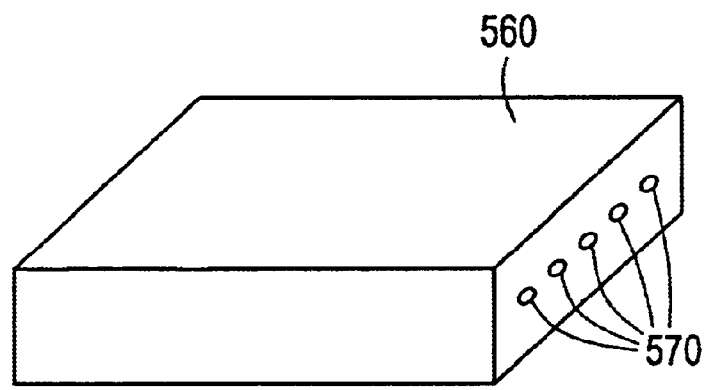
FIG. 13A and FIG. 13B are perspective views illustrating alternate light sources employed in the fifth embodiment of the present invention.
Figure 13B:
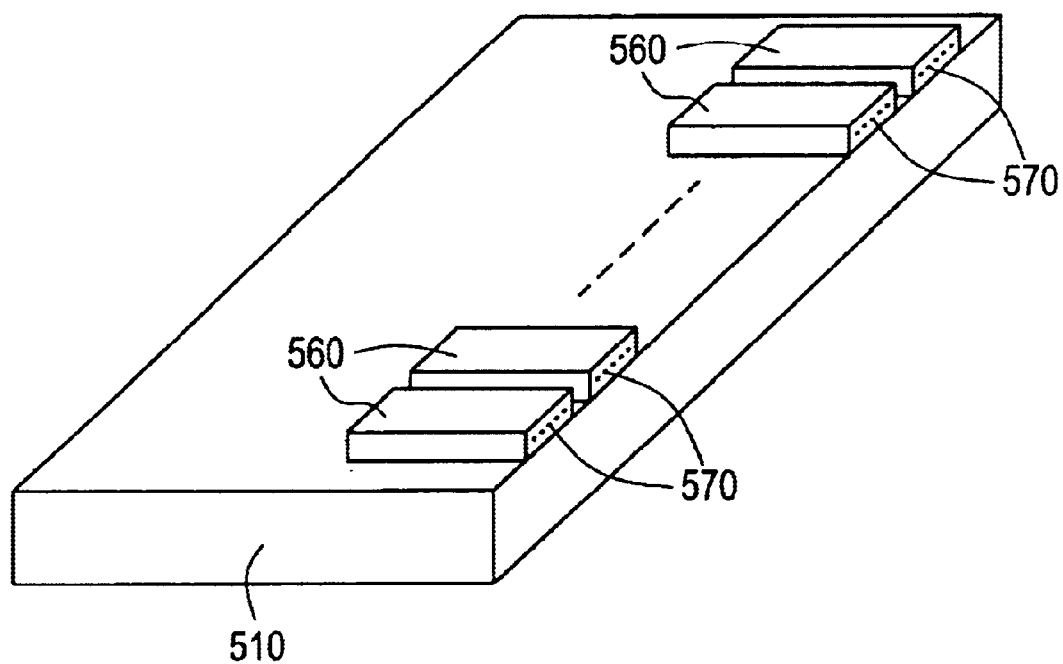

Instead of the 50W (0.5×100) linear high output beam provided by the arrayed fibers as described above, an array type semiconductor laser, in which a plurality of semiconductor laser chips 560 as shown in FIG. 13A, arranged along a predetermined direction as shown in FIG. 13B as disclosed in Japanese Patent Application 2001-273849 may be utilized. The light source 42 is constituted by a plurality of semiconductor laser chips. Each of the laser chips 560 possesses a plurality of emission points 570. If the output of each emission point 570 is 0.1W, and the number of emission points is five, the output of each of the laser chips 560 is 0.5W (0.1W×5). If the light source 42 is constituted by 34 semiconductor laser chips 560, it will be able to emit a 17W (0.5W×34) high output array beam. By arranging three of these 17W array beams, a 50W class linear high output beam can be obtained, similar to that provided by the arranged fibers described above.

The high output beam obtained by the above means is projected onto the screen after being deflected, and shows an image on said screen as in the fourth embodiment.

In the fourth and fifth embodiments described above, examples in which high output laser light sources, which utilized gallium nitride semiconductor lasers multiplexed and coupled to fibers were employed have been described. However, the high output laser light source may be of one of the six constructions described below.

1) A gallium nitride semiconductor laser. Preferably, an array type semiconductor laser comprising a plurality of gallium nitride semiconductor lasers as shown in FIG. 10 and FIG. 11.

Figure 15:
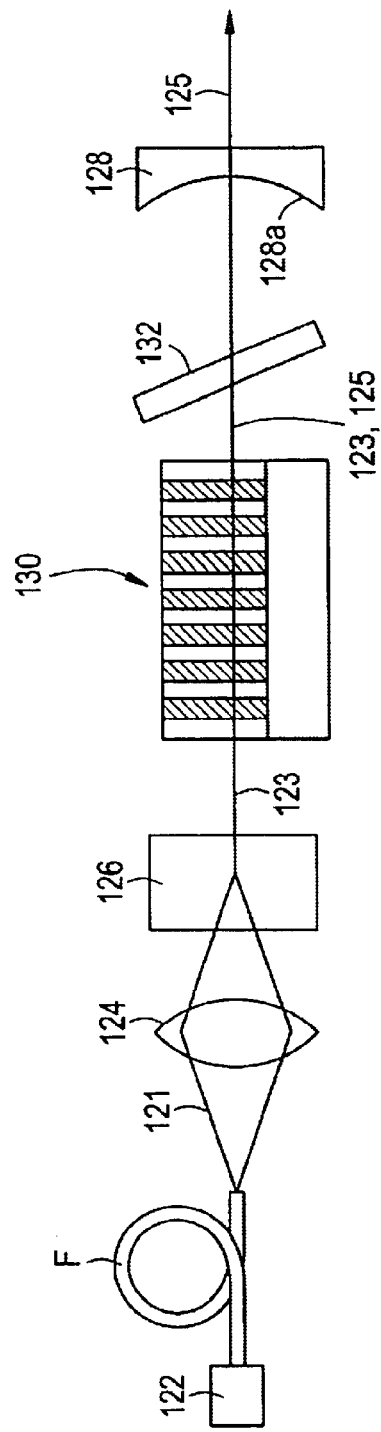
FIG. 15 is a sectional view illustrating the construction of a semiconductor laser excited solid state laser employable as the laser light source of the exposure apparatus of the present invention.

2) A semiconductor laser excited solid state laser as shown in FIG. 15, in which a laser beam, obtained by exciting a solid state laser crystal with a gallium nitride semiconductor laser, is wavelength converted by an optical wavelength conversion element then emitted.

Figure 17:
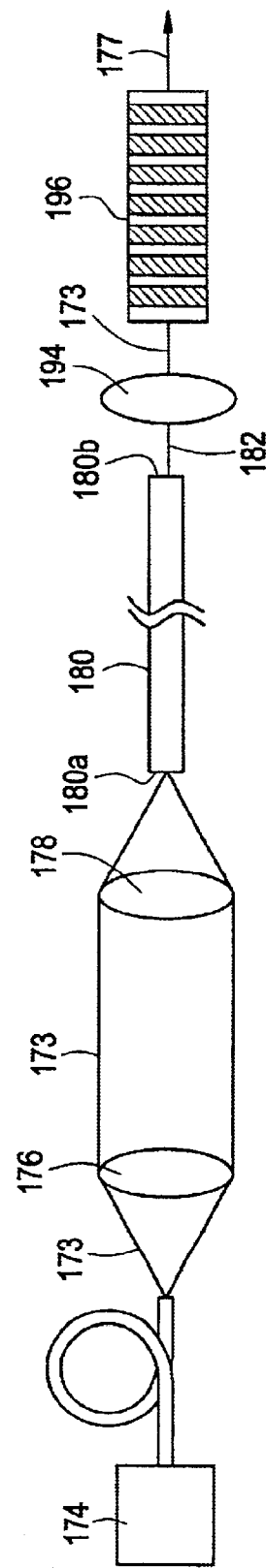
FIG. 17 is a sectional view illustrating the construction of an SHG (Second Harmonic Generation) fiber laser employable as the laser light source of the exposure apparatus of the present invention.

3) A fiber laser as shown in FIG. 17, in which a laser beam, obtained by exciting a fiber with a gallium nitride semiconductor laser, is wavelength converted by an optical wavelength conversion element then emitted.

Figure 16:
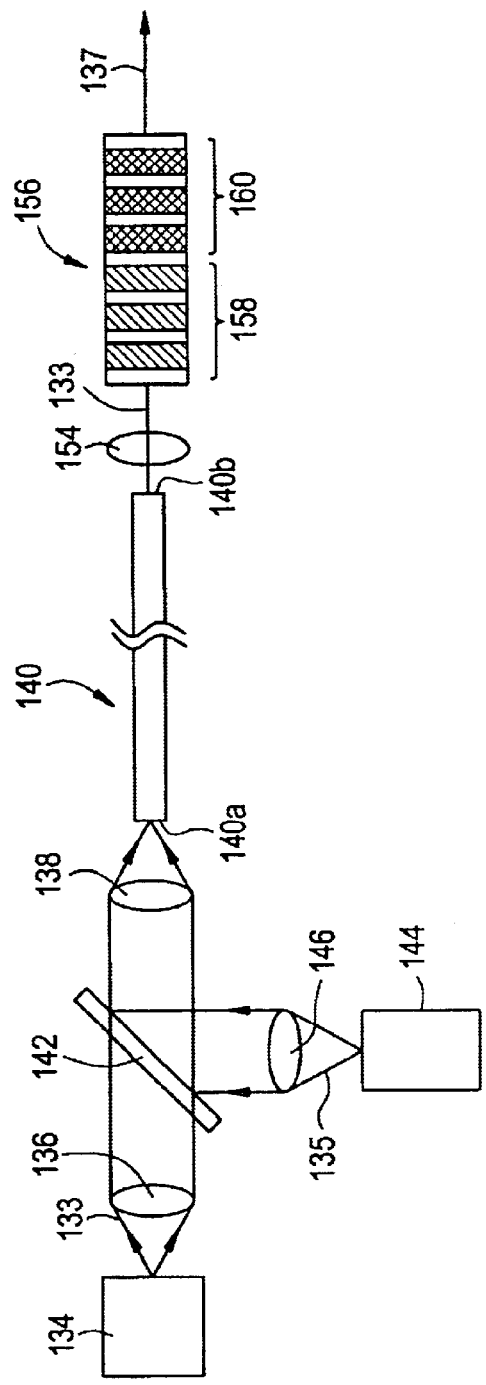
FIG. 16 is a sectional view illustrating the construction of an FHG (Fourth Harmonic Generation) fiber laser employable as the laser light source of the exposure apparatus of the present invention.

4) A fiber laser or a fiber amplifier as shown in FIG. 16, in which a laser beam, obtained by exciting a fiber with a semiconductor laser that emits light in an infrared range, is wavelength converted by an optical wavelength conversion element then emitted.

5) A linear laser light source or a planar laser light source, in which fibers, each of which are coupled to a gallium nitride semiconductor laser or a plurality of gallium nitride semiconductor lasers via a wave multiplexing optical system, are arranged in an array as shown in FIG. 12, or bundled.

6) A laser light source comprising any one of the above five laser light sources and a wave multiplexing optical system.

Figure 14:
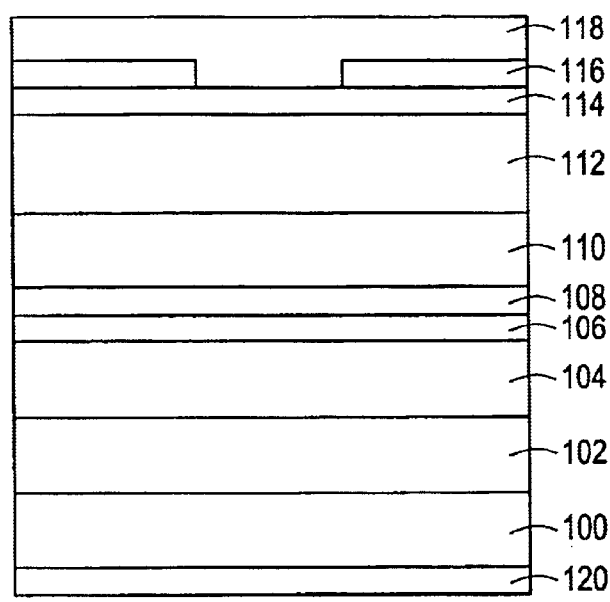
FIG. 14 is a sectional view illustrating an example of the layering structure of a GaN semiconductor laser that has a broad area emittance range employable as the laser light source of the exposure apparatus of the present invention.

FIG. 14 shows an example of a layering structure of a gallium nitride semiconductor laser having a broad area emission range, listed as 1) above. In the gallium nitride semiconductor laser having this layering structure, an n-type $Ga_{1-z1}Al_{z1}N/GaN$ super lattice cladding layer 102 (0.05<z1<1), an n-type or i-type GaN optical waveguide layer 104, an $In_{1-z2}Ga_{z2}N$ (doped with Si)/$In_{1-z3}Ga_{z3}N$ multiple quantum well active layer 106 (0.01<z2<0.05, 0.1<z3<0.3), a p-type $Ga_{0.8}Al_{0.2}N$ carrier blocking layer 108, an n-type or i-type GaN photoconductive layer 110, a p-type $Ga_{1-z1}Al_{z1}N$/GaN super lattice cladding layer 112, and a p-type GaN contact layer are sequentially layered on an n-type GaN (0001) substrate 100. An insulating film 116 is formed on the p-type GaN contact layer excepting a stripe region with a width of approximately 50 μm. A p-side electrode 118 is formed on said stripe region. An n-side electrode is formed on the reverse surface of the substrate 100. Note that the oscillation wavelength band of this semiconductor laser is 440 nm, and the width of its emission range is 50 μm. Therefore, the output obtainable therefrom is on the order of 2W, and its light conversion rate is approximately 15%. Laser light emitted from twenty five of these semiconductor lasers is input into a fiber with a core diameter of 500 μm to obtain a fiber excitation module 122 having an output of 50W.

FIG. 15 shows an example of a semiconductor laser excited solid state laser listed as 2) above, in which a laser beam, obtained by exciting a solid state laser crystal with a gallium nitride semiconductor laser, is wavelength converted by an optical wavelength conversion element then emitted. This semiconductor laser excited solid state laser comprises: an excitation module 122 that emits a laser beam 121 as the excitation light; a fiber F that has its input terminal face optically coupled to said excitation module 122; a focusing lens 124 that focuses aforementioned laser beam 121, which is emitted as a diffuse light from the fiber F; a LiYF4 crystal 126 doped with Pr3+ (hereinafter referred to as Pr:YLF crystal) which is a solid state laser medium; a resonating mirror 128 positioned on a light emission side of said Pr:YLF crystal 126; an optical wavelength conversion element 130 positioned between said Pr:YLF crystal 126 and said resonating mirror 128; and an etalon 132.

The optical wavelength conversion element 130 consists of a LiNbO3 crystal doped with MgO, which is a nonlinear optical material, provided with a frequency domain inversion structure. The frequency of the frequency domain inversion structure, for example, in the case that the fundamental wavelength is 720 nm and the wavelength of the second harmonic is 360 nm, is set to 1.65 μm to be a primary frequency relative to these wavelengths. Further, the etalon 132, which acts as the wavelength selection element, realizes noise reduction by oscillating the solid state laser in a single vertical mode.

As the semiconductor laser 122, one may be employed of a broad area type that possesses an InGan active layer and oscillates at a wavelength of 450 nm, for example. The terminal surface 126a on the light incident side of the Pr:YLF crystal 126 transmits light having a wavelength of 450 nm favorably with an 80% transmittance rate while it is highly reflective for a wavelength of 720 nm, which is one of the oscillation lines of Pr3+. The light incident side of the Pr:YLF crystal is provided with a low reflective coating with regard to the oscillation lines of Pr3+ other than 720 nm, i.e., 400 nm, 650 nm, 800 nm and longer. The terminal surface 126b on the light emission side of the Pr:YLF crystal 126 is provided with a coating that has low reflectivity with regard to light having a wavelength of 720 nm and high reflectivity with regard to a second harmonic of said light that has a wavelength of 360 nm. Meanwhile, on the mirror surface 128a of the resonating mirror 128 is provided with a coating that has high reflectivity with regard to light having a wavelength of 720 nm, transmits over 95% of light having a wavelength of 360 nm, and has low reflectivity with regard to light having wavelengths of 490 nm, 650 nm, 800 nm and longer.

In this semiconductor laser excited solid state laser, a laser beam 121 having a wavelength of 450 nm is emitted from the semiconductor laser 122 and enters the Pr:YLF crystal 126 by being transmitted through the aforementioned terminal surface 126b. The Pr:YLF crystal emits a light having a wavelength of 720 nm due to the excitation of Pr3+ by the laser beam 121. At this time, the level may be considered to be 3P0 3F4. Then, laser oscillation is caused to occur by the resonator, which comprises the terminal surface 126b of the Pr:YLF crystal and the mirror surface 128a of the resonating mirror, thereby generating a solid state laser beam 123 having a wavelength of 720 nm. This laser beam 123 enters optical wavelength conversion element 130 and is converted to a light of half its original wavelength, that is, a second harmonic 125 having a wavelength of 360 nm. As the mirror surface 128a of the resonating mirror is provided with the coating as has been described above, only second harmonic 125 having a wavelength of 360 nm is emitted from the resonating mirror 128.

FIG. 16 shows an example of fiber laser listed as 4) above, in which a laser beam, obtained by exciting a fiber with a semiconductor laser that emits light in an infrared range, is wavelength converted by an optical wavelength conversion element then emitted. This fiber laser is a FHG (Fourth Harmonic Generation) fiber laser, and comprises: a pulse DFB (Distributed Feed Back) semiconductor laser 134 that emits a laser beam 133 having a wavelength of 1560 nm; a collimating lens 136 that collimates the aforementioned laser beam 133, which is a diffuse light; a focusing lens 138 that focuses the collimated laser beam 133; a half mirror 142 positioned between said collimating lens 136 and said focusing lens 138; a fiber 140 having a core which has been doped with both Er3+ and Yb3+; a focusing lens 154 that focuses the laser beam 133 emitted from said fiber 140; and a wavelength conversion portion 156 that obtains a wavelength converted light from the focused laser beam 133 incident thereto.

The wavelength conversion portion 156 consists of a SHG (Second Harmonic Generation) element 158 that converts the laser beam 133 incident thereto into a laser beam having half the original wavelength thereof (780 nm) and a FHG (Fourth Harmonic Generation) element 160 that converts the laser beam 133 incident thereto into a laser beam having a quarter of the original wavelength thereof (390 nm). Both the SHG element 158 and the FHG element 160 are bulk type wavelength conversion crystals consisting of a LiNbO3 doped with MgO, which is a nonlinear optical material, provided with a frequency domain inversion structure.

A semiconductor laser 144 that emits a laser beam 135 having a wavelength of 940 nm is positioned on the side of the half mirror 142 to which the light is incident (in the figure, the lower side of the half mirror 142). A collimating lens 146 is positioned between the semiconductor laser 144 and the half mirror 142.

As shown in FIG. 16, at the fiber 140, the laser beam 133 is amplified by receiving energy from fluorescent materials of the same wavelength (1560 nm), and is emitted from the emission terminal surface 140b of said fiber 140. The laser beam 133, having a wavelength of 1560 nm, is focused by the focusing lens 154 and enters the wavelength conversion portion 156. The laser beam 133 is converted into a fourth harmonic thereof at the wavelength conversion portion, and is emitted therefrom as a laser beam 137 having a wavelength of 390 nm. Note that an output of 5W can be obtained by this fiber laser.

Note that this fiber laser may also be constructed as a THG (Third Harmonic Generation) fiber laser by constructing the wavelength conversion portion with a SHG (Second Harmonic Generation) element that converts a laser beam incident thereto into a laser beam having half the original wavelength thereof, and a THG (Third Harmonic Generation) element that converts a laser beam incident thereto into a laser beam having a third of the original wavelength thereof.

FIG. 17 shows a fiber laser listed as 3) above, in which a laser beam, obtained by exciting a fiber with a gallium nitride semiconductor laser, is wavelength converted by an optical wavelength conversion element then emitted. This fiber laser is a SHG (Second Harmonic Generation) laser, and comprises: a fiber input excitation module 174 that employs a gallium nitride semiconductor laser to emit a laser beam 173 having a wavelength of 450 nm; a collimating lens 176 that collimates said laser beam 173, which is a diffuse light; a focusing lens 178 that focuses said collimated laser beam 173; a fiber 180 that has a core doped with Pr3+; a focusing lens 194 that focuses the laser beam 182 having a wavelength of 720 nm emitted from said fiber 180; and a SHG (Second Harmonic Generation) element 196 that converts laser beam 182, which has been focused by focusing lens 194 into a laser beam 177 having half the wavelength thereof (360 nm). The SHG element 196 is a bulk type wavelength conversion crystal consisting of a LiNbO3 doped with MgO, which is a nonlinear optical material, provided with a frequency domain inversion structure. A coating is provided on the terminal faces 180a and 180b of the fiber 180 that has an AR (Anti Reflective) property with regard to light of the aforementioned wavelengths.

In this fiber laser, the laser beam 173 having a wavelength of 450 nm emitted from the fiber input excitation module 174 that employs a gallium nitride semiconductor laser is focused by the focusing lens 178 and enters the fiber 180. Fluorescence of a wavelength of 720 nm is generated by the laser beam 173 within said fiber 180, is resonated between the two terminal surfaces 180a and 180b thereof, and a laser beam 182 having a wavelength of 720 nm is emitted from emission terminal surface 180b. The laser beam 182 having a wavelength of 720 nm emitted from the fiber 180 is focused by the focusing lens 194 and is input to the SHG element 196. The laser beam 182 is converted into a second harmonic thereof by the SHG element, and is emitted therefrom as a laser beam 177 having a wavelength of 360 nm.

In the fourth and fifth embodiments described above, examples in which an optical modulation array element consisting of an array of GLV (Grating Light Valve) elements, which are one type of SLM (Spatial Light Modulator) of a MEMS (Micro Electro Mechanical Systems) type have been described. However, the light beam may be modulated by other modulating means. Note that the term MEMS refers collectively to all micro systems including micro sized sensors, actuators, and control circuits manufactured by micromachining technology with IC (Integrated Circuit) manufacturing processes as a base. In this case, the MEMS type SLM refers to a spatial light modulator driven by an electromechanical operation that utilizes static electricity.

For example, in the case that the laser light source is to be continuously driven with a low light output, spatial light modulators other than those of an MEMS type, such as a PLZT (Plomb Lanthanum Zirconate Titanate) element, which is an optical element that modulates the transmitted light through an electro optical effect, or a liquid crystal shutter may be employed. Or, in the case that the laser light source is to be pulse driven or driven at a high output, spatial light modulators such as a DMD (Digital Mirror Device), a total reflection type spatial light modulator, an interference type spatial light modulator, a reflection type spatial light modulator, or another MEMS type spatial light modulator may be employed.

Further, in the case that a two dimensional spatial light modulator such as a DMD is employed, the light beams from the light sources listed above (1–6) are irradiated on said spatial light modulator two dimensionally. Particularly in the case that a laser light source in which fibers, each of which are coupled to a gallium nitride semiconductor laser or a plurality of gallium nitride semiconductor lasers via a wave multiplexing optical system as listed as 5) above is utilized, it is preferable that said fibers shown in FIG. 12 are bundled to provide a planar laser light source. The light modulated by a two dimensional spatial light modulator such as a DMD is irradiated onto a projection optical system that corresponds to the projection optical system 56 shown in FIG. 4, projected onto the screen, and shows an image thereon by simultaneously exciting the desired fluorescent materials thereon. In the case that a two dimensional spatial light modulator such as a DMD is employed, the necessity to scan the light from the optical modulation element as in the fourth embodiment is obviated.

In the fourth and fifth embodiments, a single laser light source 42 excited the R (Red), G (Green) and B (Blue) fluorescent materials. However, laser light sources 42 dedicated to each of said R, G, and B fluorescent materials may be employed, similar to the second embodiment illustrated in FIG. 2. In this case, the laser light emitted from each of the plurality of laser light sources 42 is mixed by being either reflected or transmitted by a dichroic mirror as illustrated in FIG. 2. This mixed laser light may be employed as the laser light of the fourth or fifth embodiments, and each of the R, G, and B fluorescent materials may be excited by a laser light source 42 dedicated thereto.

Figure 18:
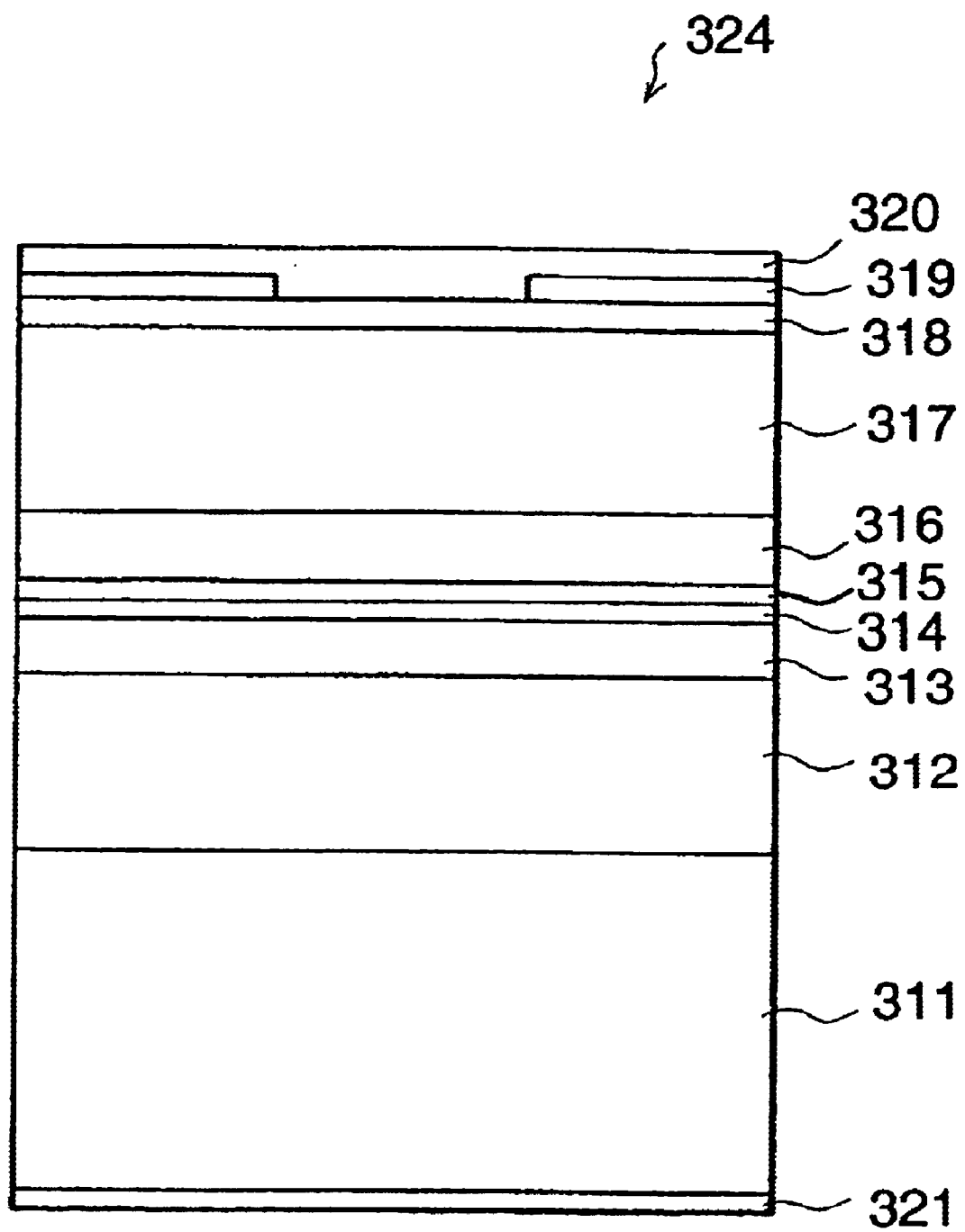
FIG. 18 is a sectional view illustrating a further embodiment of the instant invention.

An additional embodiment of the instant invention comprises a semiconductor laser element used as an excitation light source which emits laser light in the 360 nm band as excitation light. FIG. 18 is a cross-sectional view of the semiconductor laser. This semiconductor laser element used as an excitation light source is produced as follows.

Initially, an n-type GaN (0001) substrate 311 is formed in accordance with the method described in Japanese Journal of Applied Physics Part 2 Letters, vol. 37, 1998, pp. L1020. Then, an n-type $Ga_{1-z1}Al_{z1}N$/GaN superlattice cladding layer 312 ($0<z1<1$), and n-type or i-type (intrinsic) $Ga_{1-z1}Al_{z1}N$ optical waveguide layer 313 ($z1>z2>0$), a $Ga_{1-z2}Al_{z2}N$ (doped with Si)/GaN multiple-quantum-well active layer 314, a p-type $Ga_{1-z3}Al_{z3}N$ carrier blocking layer 315 ($0.5>z3>z3$), an n-type or i-type $Ga_{1-z2}Al_{z2}N$ optical waveguide layer 316 ($z1>z2>0$), a p-type $Ga_{1-z1}Al_{z1}N$/GaN superlattice cladding layer 317 ($0<z1<1$), and a p-type GaN contact layer 318 are formed on the n-type GaN (0001) substrate 311 by organomettalic vapor phase epitaxy. Thereafter, a $SiO_2$ insulation film 319 is formed over the p-type GaN contact layer 318, and a stripe area of the $SiO_2$ insulation film 319 having a width of about 100 $\mu$m is removed by normal lithography. Then, a p electrode 320 is formed over the $SiO_2$ insulation film 19 and the stripe area of the p-type GaN contact layer 318, the substrate 311 is polished, and an n electrode 321 is formed on the polished surface of the substrate 311. Finally, a resonator is formed by cleavage, and a high reflectance coating and a low reflectance coating are provided on the respective end surfaces so as to form a resonator. Then, the construction of FIG. 18 is formed into a chip.

Figure 19:
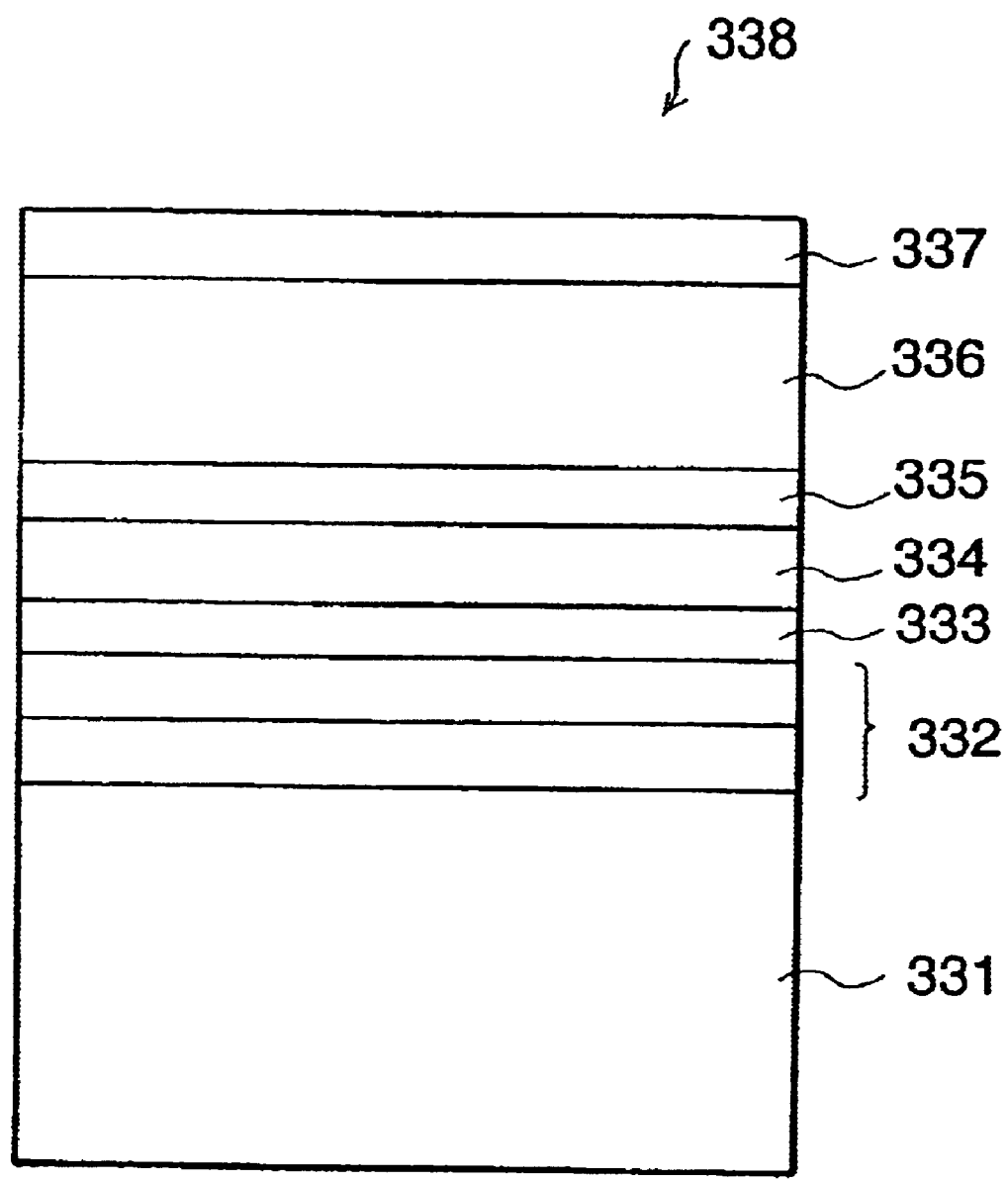
FIG. 19 is a further sectional view illustrating another embodiment of the instant invention.

FIG. 19 is a cross-sectional view of a surface-emitting semiconductor element which is also used as part of the laser apparatus of an exemplary embodiment of the instant invention. The surface-emitting semiconductor element of FIG. 19 is excited with excitation laser light emitted from the semiconductor laser element of FIG. 18, and oscillates in a single transverse mode. The surface-emitting semiconductor element used as a part of the laser apparatus of an exemplary embodiment of the instant invention is produced as follows.

Initially, a superlattice distributed reflection film 332, a GaN optical confinement layer 333, and $In_{x2}Ga_{1-x2}N/In_{x3}Ga_{1-x3}N$ multiple-quantum-well active layer 334 ($0<x2<x3<0.5$), a GaN optical confinement layer 335, and an $Al_{z4}Ga_{1-z4}N$ layer 336 ($0<z4<0.5$) are formed on a GaN (0001) substrate 331 by organometallic vapor phase epitaxy, where the superlattice distributed reflection film 332 is comprised of 20 pairs of AlN and GaN layers, the GaN layer in each pair has a thickness of $\lambda/4n_{GaN}$, the AlN layer in each pair has a thickness of $\lambda/4n_{AlN}$, $\lambda$ is an oscillation wavelength of the surface-emitting semiconductor element of FIG. 19, and $N_{GaN}$ and $N_{AlN}$ are the refractive indexes of GaN and IlN at the oscillation wavelength $\lambda$, respectively. Next, a $ZrO_2$ antireflection coating 337 having a thickness of $\lambda/4n_{Zro2}$ is formed over the construction layered as above, by electron beam evaporation, where $n_{Zro2}$ is the refractive index of Zro2 at the oscillation wavelength $\lambda$. Thereafter, the substrate 331 is polished, and the layered structure formed as above is cleaved, and further formed into a chip.

The wavelength $\lambda$ of light emitted by the surface-emitting semiconductor element 338 of FIG. 19 can be controlled in the range between 380 and 560 nm by appropriately adjusting the composition of the $In_{x3}Ga_{1-x3}N$ multiple-quantum-well active layer 334.

In order to sufficiently absorb the excitation laser light, it is preferable that the number of quantum wells in the multiple-quantum-well active layer 334 is 20 or more, and it is further preferable that the number of quantum wells is about 24 since the surface-emitting semiconductor element 338 is prone to crack due to excessive thickness when the number of the quantum wells exceeds 24.

Figure 20:
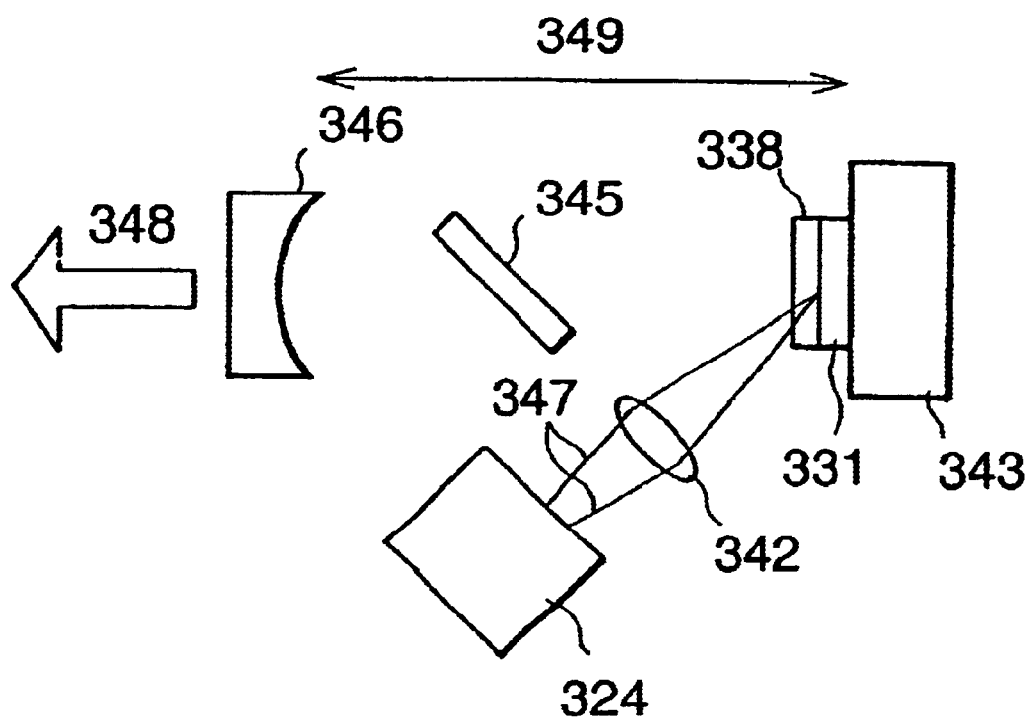
FIG. 20 is yet an additional sectional view illustrating a further embodiment of the instant invention.

FIG. 20 is a diagram illustrating a further embodiment of the instant invention. The laser apparatus of FIG. 20 comprises the semiconductor laser element 324 (for example, the semiconductor element 324 as shown in FIG. 18) as the excitation light source, the surface-emitting semiconductor element 338 (for example, the surface-emitting semiconductor element 338 as shown in FIG. 19) bonded to a heatsink 343 at the surface of the substrate 331, a concave mirror 346 as an output mirror, a resonator 349 formed by a concave surface of the concave mirror 346 and the superlattice distributed reflection film 332 of the surface-emitting semiconductor element 338, and a Brewster plate 345 arranged in the resonator 349. The Brewster plate 345 controls polarization.

In the construction of the device of FIG. 20, excitation laser light 347 emitted from the semiconductor laser element 324 is collected by the lens 342 into the semiconductor layers of the surface-emitting semiconductor element 338, and excites the surface-emitting semiconductor element 338. Then, light emitted by the surface-emitting semiconductor element 338 resonates in the resonator 349, and laser light 348 exits from the output mirror 346.

Since the GaN substrate 331 of the surface-emitting semiconductor element 338 is not transparent to the excitation laser light 347 emitted from the semiconductor laser element 324, the surface-emitting semiconductor element 338 is excited with the excitation laser light 347 from the lateral side of the surface-emitting semiconductor element 338, as illustrated in FIG. 20.

The laser apparatus of FIG. 20 has the following advantages.

(a) Since the thermal conductivity of the GaN substrate 331 is great, heat dissipation of the surface-emitting semiconductor element 338 is easy when the surface-emitting semiconductor element 338 is bonded to the heatsink 343 at the surface of the GaN substrate 331 as illustrated in FIG. 20. In addition, beam deformation due to the thermal lens effect is very small in surface-emitting semiconductor elements. Therefore, the laser apparatus of FIG. 20 can achieve higher output power than the conventional laser apparatuses using semiconductor laser elements.

(b) High speed modulation of the output laser light of the laser apparatus of FIG. 20 can be achieved by directly modulating the semiconductor laser element 324, while high speed modulation is difficult in the conventional solid-state laser.

(c) Since the semiconductor laser elements 324 can be a broad area type semiconductor laser element as described with reference to FIG. 18, the semiconductor laser element 324 can emit laser light with high output power (e.g., 1 to 10 watts). Therefore, the output power of the laser apparatus of FIG. 3 can be hundreds of milliwatts to several watts.

(d) The surface-emitting semiconductor element 338 is excited with light, and is therefore different from the usual semiconductor laser elements driven by current injection, in that the surface-emitting semiconductor element 338 is free from the problem of deterioration with elapse of time due to short-circuit currents caused by diffusion of dopants such as magnesium. Thus, the lifetime of the laser apparatus of FIG. 20 is long.

What is claimed is:

1. A color laser display apparatus comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said laser light source is a semiconductor laser device having an active layer made of a GaN material.

2. A color laser display apparatus according to claim 1, wherein said semiconductor laser device is one of a tapered-amplifier type, an $\alpha$-DFB type, a phase-synchronization array type, and a surface emitting type.

3. The color laser display apparatus of claim 1, further wherein said laser light source is a $In_xGa_{1-x}N$ laser.

4. The laser display apparatus of claim 3, further wherein the $In_xGa_{1-x}N$ meets the following equation: ($0<x<0.2$).

5. The laser display apparatus of claim 4, further wherein the wavelength of the ultraviolet laser light is 420 nm or less.

6. The laser display apparatus of claim 1, further wherein the wavelength of the ultraviolet laser light is 420 nm or less.

7. The laser display apparatus of claim 6, further wherein the laser light source is at least one of the following: GaN, $In_xGa_{1-x}N$, $GaN_yAs_{1-y}$, $In_xGa_{1-x}N_yAs_{1-y}$, and $Al_xGa_{1-x}N$, where $0<x<1$ and $o<y<1$.

8. A color laser display apparatus comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said laser light source includes,
a semiconductor laser device which has an active layer made of a GaN material so as to emit excitation laser light, and
a surface emitting semiconductor laser device which has an active layer made of a GaN material and formed on a substrate, and is excited by the excitation laser light to emit said ultraviolet laser light.

9. A color laser display apparatus comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said laser light source is a fiber laser device including,
an excitation light source which emits excitation light,
an optical fiber doped with at least one rare earth element which emits a laser beam when excited by the excitation light, where the at least one rare earth element includes Pr3+, and
a wavelength conversion element which converts said laser beam into said ultraviolet laser light.

10. A color laser display apparatus comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said light source is;
a gallium nitride semiconductor laser; or a semiconductor laser excited solid state laser in which a laser beam, obtained by exciting a solid state laser crystal with a gallium nitride semiconductor laser, is wavelength converted by an optical wavelength conversion element then emitted; or
a fiber laser or a fiber amplifier in which a laser beam, obtained by exciting a fiber with a semiconductor laser that emits light in an infrared range, is wavelength converted by an optical wavelength conversion element then emitted; or
a fiber laser, in which a laser beam, obtained by exciting a fiber with a gallium nitride semiconductor laser, is wavelength converted by an optical wavelength conversion element then emitted.

11. A color laser display device according to claim 10 wherein said spatial light modulator comprises reflective diffraction grating type grating light valve elements consisting of:
a plurality of fixed microelements having a first reflective surface formed thereon; and
a plurality of movable microelements having a second reflective surface formed thereon;
wherein said fixed and movable microelements are alternately arranged on a substrate in a predetermined direction, so that when static electricity is applied, the movable microelements move, changing the distance between the first and second reflective surfaces, thereby diffracting light incident thereto.

12. A color laser display comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said laser light modulating means comprises a spatial light modulator driven by an electromechanical operation that utilizes static electricity.

13. A color laser display according to claim 12 wherein said spatial light modulator is a digital micro mirror device comprising a plurality of movable micro mirrors.

14. A color laser display device according to claim 12 wherein said spatial light modulator comprises grating light valve elements of a reflective diffraction grating type.

15. A color laser display according to claim 14, wherein said spatial light modulator comprises a plurality of grating light valve elements that are arranged in a single line in a direction substantially perpendicular to said scanning direction, or arranged as a light modulating array in a plurality of rows.

16. A color laser display according to claim 15 wherein the lengthwise direction of the grating of said grating light valve elements match the arranging direction of said light modulating array.

17. A color laser display according to claim 14 wherein said spatial light modulator is positioned so that it is rotated at a predetermined angle in relation to the optical axis around the normal line of the surface thereof.

18. A color laser display comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said laser light source comprises:
a first laser light source which is plurality of gallium nitride semiconductor lasers each coupled to a plurality of fibers; and
a second laser light source which is a plurality of gallium nitride semiconductor lasers coupled to a plurality of fibers via a wave multiplexing optical system;
wherein the fibers of at least one of said first and second laser light sources is arranged in an array form to constitute a linear laser light source that emits a linear laser light flux; or
wherein the fibers of at least one of said first second laser light sources is arranged in a bundle form to constitute a planar laser light source that emits a spot beam laser light flux.

19. A color laser display comprising:
a laser light source which emits ultraviolet laser light;
a modulation unit which modulates said ultraviolet laser light;
a display unit which includes a fluorescent screen; and
a scanning unit which two-dimensionally scans said fluorescent screen with said ultraviolet laser light;
said fluorescent screen including for each pixel,
red fluorescent material which emits red light in response to said ultraviolet laser light,
green fluorescent material which emits green light in response to said ultraviolet laser light, and
blue fluorescent material which emits blue light in response to said ultraviolet laser light;
wherein said laser light source comprises a plurality of laser light sources that emit o light beams with a predetermined wavelength range that includes ultraviolet, and a wave multiplexing optical system that multiplexes the laser light emitted from said plurality of laser light sources.

* * * * *